(12) United States Patent
Krainak et al.

(10) Patent No.: US 6,188,705 B1
(45) Date of Patent: Feb. 13, 2001

(54) FIBER GRATING COUPLED LIGHT SOURCE CAPABLE OF TUNABLE, SINGLE FREQUENCY OPERATION

(75) Inventors: Michael A. Krainak, Eldersburg; Gary L. Duerksen, Lanham, both of MD (US)

(73) Assignee: The United States of America as represented by the Administrator of the National Aeronautics and Space Administration, Washington, DC (US)

(*) Notice: Under 35 U.S.C. 154(b), the term of this patent shall be extended for 0 days.

(21) Appl. No.: 09/079,383

(22) Filed: May 15, 1998

Related U.S. Application Data

(60) Provisional application No. 60/044,378, filed on May 16, 1997.

(51) Int. Cl.[7] .............................. H01S 5/068; H01S 5/065
(52) U.S. Cl. ................................ 372/32; 385/37; 372/19; 372/6; 372/102; 356/331; 250/339.07
(58) Field of Search .................................. 385/37; 372/19, 372/96, 102, 6, 32, 101; 250/339.1, 339.07; 356/331, 332, 334

(56) References Cited

U.S. PATENT DOCUMENTS

| | | | |
|---|---|---|---|
| 3,835,415 | * 9/1974 | Rutz et al. ............................. | 372/19 |
| 4,464,759 | 8/1984 | Haus et al. . | |
| 4,482,248 | 11/1984 | Papuchon et al. . | |
| 4,656,641 | * 4/1987 | Scifres et al. ......................... | 372/103 |
| 4,678,332 | 7/1987 | Rock et al. . | |
| 4,990,780 | 2/1991 | Lee et al. . | |
| 5,020,910 | 6/1991 | Dunn et al. . | |
| 5,042,898 | 8/1991 | Morey et al. . | |
| 5,050,991 | 9/1991 | Welch . | |

(List continued on next page.)

FOREIGN PATENT DOCUMENTS

0718936 A1  6/1996  (EP) .
59-151482A  8/1984  (JP) .

OTHER PUBLICATIONS

PCT International Search Report for PCT/US 99/10710, International Filing Date:May 14, 1999 for application entitled "Fiber Grating Coupled Light Source Capable of Tunable, Single Frequency Operation," Inventors: Michael A. Krainak and Gary L. Duerksen, 4 pages with 6 attachments. (No Publication Date Available).

(List continued on next page.)

Primary Examiner—Rodney Bovernick
Assistant Examiner—Michael J. Stahl

(57) ABSTRACT

Fiber Bragg grating coupled light sources can achieve tunable single-frequency (single axial and lateral spatial mode) operation by correcting for a quadratic phase variation in the lateral dimension using an aperture stop. The output of a quasi-monochromatic light source such as a Fabry Perot laser diode is astigmatic. As a consequence of the astigmatism, coupling geometries that accommodate the transverse numerical aperture of the laser are defocused in the lateral dimension, even for apsherical optics. The mismatch produces the quadratic phase variation in the feedback along the lateral axis at the facet of the laser that excites lateral modes of higher order than the $TM_{00}$. Because the instability entails excitation of higher order lateral submodes, single frequency operation also is accomplished by using fiber Bragg gratings whose bandwidth is narrower than the submode spacing. This technique is particularly pertinent to the use of lensed fiber gratings in lieu of discrete coupling optics.

Stable device operation requires overall phase match between the fed-back signal and the laser output. The fiber Bragg grating acts as a phase-preserving mirror when the Bragg condition is met precisely. The phase-match condition is maintained throughout the fiber tuning range by matching the Fabry-Perot axial mode wavelength to the passband center wavelength of the Bragg grating.

50 Claims, 23 Drawing Sheets

U.S. PATENT DOCUMENTS

| | | |
|---|---|---|
| 5,056,096 | 10/1991 | Baker et al. . |
| 5,161,165 | 11/1992 | Zorabedian . |
| 5,184,193 | 2/1993 | Lefebre . |
| 5,208,819 | 5/1993 | Huber . |
| 5,257,085 | 10/1993 | Ulich et al. . |
| 5,283,801 | 2/1994 | Mecherle . |
| 5,298,751 | 3/1994 | Fee et al. . |
| 5,299,212 | 3/1994 | Koch et al. . |
| 5,305,335 | 4/1994 | Ball et al. . |
| 5,321,718 * | 6/1994 | Waarts et al. ................. 372/108 |
| 5,337,328 | 8/1994 | Lang et al. . |
| 5,365,334 | 11/1994 | Bottka . |
| 5,379,310 | 1/1995 | Papen et al. . |
| 5,380,995 | 1/1995 | Udd et al. . |
| 5,392,305 | 2/1995 | Jakobson . |
| 5,392,308 | 2/1995 | Welch et al. . |
| 5,394,488 | 2/1995 | Fernald et al. . |
| 5,425,039 | 6/1995 | Hsu et al. . |
| 5,430,748 | 7/1995 | MacCormack et al. . |
| 5,436,459 | 7/1995 | Koch et al. . |
| 5,442,651 | 8/1995 | Maeda . |
| 5,444,803 | 8/1995 | Kim et al. . |
| 5,445,964 | 8/1995 | Lee et al. . |
| 5,461,635 * | 10/1995 | Basiev et al. .................. 372/42 |
| 5,469,520 | 11/1995 | Morey et al. . |
| 5,485,481 | 1/1996 | Ventrudo et al. . |
| 5,499,261 | 3/1996 | Welch et al. . |
| 5,510,894 | 4/1996 | Batchelder et al. . |
| 5,537,432 | 7/1996 | Mehuys et al. . |
| 5,600,142 | 2/1997 | Van Den Berg et al. . |
| 5,636,035 | 6/1997 | Whittaker et al. . |
| 5,640,014 | 6/1997 | Sauke et al. . |
| 5,651,018 | 7/1997 | Mehuys et al. . |
| 5,666,372 | 9/1997 | Ball et al. . |
| 5,675,081 | 10/1997 | Solheim et al. . |
| 5,699,377 | 12/1997 | Pan . |
| 5,786,893 * | 7/1998 | Fink et al. ..................... 356/301 |

OTHER PUBLICATIONS

Y. Zhao and C. Shu, "Single–Mode Operation Characterisitics of a Self–Injection Seeded Fabry–Perot Laser Diode with Distributed Feedback from a Fiber Grating" IEEE Photonics Technology Letters, vol. 9, No. 11, pp. 1436–1438, Nov. 1, 1997.

E. Brinkmeyer et al. "Fibre Bragg Reflector for Mode Selection and Line–Narrowing of Injection Lasers" Electronics Letters, vol. 22, No. 3, pp. 134–135, Jan. 30, 1986.

M. Ibsen et al., "Broadly Tunable DBR Fibre Laser Using Sampled Fibre Bragg Gratings," Electronics Letters, vol. 31, No. 1, pp. 37–38, Jan. 5, 1995.

S. M. Lord et al. "Using Fibre Gratings to Stabilise Laser Diode Wavelength under Modulation for Atmospheric Lidar Transmitters," Electronics Letters, vol. 32, No. 6, pp. 561–563, Mar. 14, 1996.

Y. J. Rao, D.J. Webb, D.A. Jackson, L. Zhang and I. Bennion, "High–resolution, wavelength–division–multiplexed in–fibre Bragg grating sensor system," Electronic Letters, vol. 32, No. 10, 924–926, May 9, 1996.

M. J. Goetz Jr., M.D. Fox, and R.B. Northrup, "Microdegree Polarimetry Using a Diode Laser for Glucose Detection," 0–7803–0902–2, pp. 97–98, © IEEE 1992. (No Month Available).

A. Celikov, P. Kersten, F. Riehle, G. Zinner, L. D'Evelyn, A. Zibrov, V. Velichansky, J. Helmcke, "External Cavity Diose Laser High Resolution Spectroscopy of the Ca and Sr Intercombination Lines for the Development of a Transportable Frequency/Length Standard," 1995 IEEE International Frequency Control Symposium, pp. 153–160, 0–7803–2500–1/95 © IEEE 1995. (No Month Available).

A. F. H. Goetz and J.W. Boardman, "Spectroscopic Measurement of Leaf Water Status," 0–7803–2567–2/95 © 1995 IEEE, pp. 978–980, (No Month Available).

M. A. Davis and A.D. Kersey, Application of a Fiber Fourier Transform Spectrometer to the Detection of Wavelength––Encoded Signals from Bragg Grating Sensors, Journal of Lightwave Technology, vol. 13, No. 7, pp. 1289–1295, Jul., 1995.

G. Martinelli, M. Douay, D. Pureur, P. Bernage, P. Niay, J.F. Henninot, C. Li, P. Carette, J.F. Bayon and S. Boj, "Design of a photowritten cavity neodymium–doped fiber laser tunable around an absorption molecular line," Applied Optics, vol. 34, No. 24, pp. 5338–5342, Aug. 20, 1995.

M. W. Beranek, J.C. Bartella, B.A. Capron, D.M. Griffith, D.G. Koshinz, D.L. Livezey, and H.P. Soares, Jr., "Physical Design and Fabrication of a Multiple Element Slab Waveguide Spectrograph for Multimode Fiber–Optic WDM Systems," IEEE Transactions on Components, Hybrids, and Manufacturing Technology, vol. 16, No. 5, pp. 511–516, Aug., 1993.

B. A. Capron, M.W. Beranek, R.W. Huggins, and D.G. Koshinz, "Design and Performance of a Multiple Element Slab Waveguide Spectrograph for Multimode Fiber–Optic WDM Systems," Journal of Lightwave Technology, vol. 11, No. 12, pp. 2009–2014, Dec., 1993.

J. L. Cruz, A. Diez, M.V. Andres, A. Segura, B. Ortega and L. Dong, "Fibre Bragg gratings tuned and chirped using magnetic fields," Electronics Letters, vol. 33, No. 3, pp. 235–236, Jan. 30, 1997.

M. P. Arroyo and R.K. Hanson, "Absorption measurements of water vapor concentration, temperature, and line–shape parameters using a tunable InGaAsP diode laser," Applied Optics, vol. 32, No. 30, pp. 6104–6116, Oct. 20, 1993.

A. Lucchesini, L. Dell'Amico, I. Longo, C. Gabbanini, S. Gozzini and L. Moi, "Diode Laser Spectroscopy: Water Vapour Detection in the Atmosphere," IL NUOVO CIMENTO, vol. 13, D, N. 5, pp. 677–685, May 1991.

G. Spanner and R. Niessner, "New concept for the non–invasive determination of physiological glucose concentrations using modulated laser diodes," Fresnius J. Anal Chem, 354:306–310, Springer–Verlag 1996, (No Month Available).

H. M. Pask, R. J. Carman, D. C. Hanna, A. C. Tropper, C. J. Mackechnie, P. R. Barber, and J. M. Dawes, "Ytterbium––Doped Silica Fiber Lasers: Versatile Sources for the 1–1.2 $\mu$m Region," IEEE Journal of Selected Topics in Quantum Electronics, vol. 1, No. 1, pp. 2–13, Apr., 1995.

S. B. Bambot, "Sensing oxygen through skin using a red diode laser and fluorescence lifetimes," Biosensors & Biolectronics, vol. 10, No. 6/7 pp. 643–652 (1995), (No Month Avail.).

T. Fujii, T. Nayuki, K. Nemoto, M. Kozuma, M. Kourogi and M. Ohtsu, Jpn. J. Appl. Phys. 35 (1996) 6090, (Dec.).

T Nayuki, T. Fujii, K. Nemoto, M. Kourogi and M. Ohtsu, "Continuous Wavelength Sweep of External Cavity 630nm Laser Diode without Antireflection Coating on Output Facet," Optical Review, vol. 5, No. 5, pp. 267–270 (1998), (No Month Available).

X.–Z. Lin, Y. Zhang, H.–L. An and and H.–D. Liu, "Electrically tunable singlemode fibre Bragg reflective filter," Electronics Letters, vol. 30, No. 11, pp. 887–888, May 26, 1994.

Jorg Heerlein, Martin Grabherr, Roland Jager, and Peter Unger, "Single–Mode AlGaAs–GaAs Lasers Using Lateral Confinement by Native–Oxide Layers" IEEE Photonics Technology Letters, vol. 10, No. 4, pp. 498–500, Apr. 1998.

W. V. Sorin and S.A.Newton, "Tunable Single–Mode Output of a Multimode Laser in a Tunable Fibre Grating External Cavity" Electronics Letters, vol. 23, No. 8, pp. 390–391, Apr. 9, 1987.

A. K. Goyal, P, Gavrilovic, and H.Po, "1.35 W of Stable Single–Frequency Emission From an External–Cavity Tapered Oscillator Utilizing Fiber Bragg Grating Feedback" Applied Physics Letters, vol. 73, No. 5, pp. 575–577, Aug. 3, 1998.

Akira Inoue, Masakazu Shigehara, Masumi Ito, Maki Inai, Yasuji Hattori, and Toru Mizunami, "Fabrication and Application of Fiber Bragg Grating—A Review" Optoelectronics–Devices and Technologies, vol. 10, No. 1, pp. 119–130, Mar. 1995.

M. Feher and P.A. Martin, "Review Tunable Diode Laser Monitoring of Atmospheric Trace Gas Constituents" Spectrochimica Acta, Part A 51, pp. 1579–1599, 1995, (No Month Available).

* cited by examiner

FIBER GRATING COUPLED LIGHT SOURCE CAPABLE OF TUNABLE, SINGLE FREQUENCY OPERATION

CROSS-REFERENCES TO RELATED PATENT APPLICATIONS

This application claims the benefit of priority under 35 U.S.C. Section 119(e) to U.S. provisional patent application serial no. 60/044,378, filed May 16, 1997, entitled "Diode Laser Spectrometer Using Fiber Optic Grating & Optical Amplifier for Active Remote and Non-Invasive Spectroscopy."

GOVERNMENT RIGHTS

The invention described herein was made in the performance of work under a NASA contract and by an employee of the United States Government and is subject to the provisions of Section 305 of the National Aeronautics and Space Act of 1958, Public Law 85-568 (72 Stat. 435; 42 U.S.C. 2457, as amended), and may be manufactured and used by or for the Government for governmental purposes without the payment of any royalty thereon or therefor.

FIELD OF THE INVENTION

The invention relates to tunable fiber grating coupled quasi-monochromatic light sources. In particular, the invention relates to the use of fiber grating coupled quasi-monochromatic light sources embodied in a spectrometer.

BACKGROUND

Fiber grating coupled quasi-monochromatic light sources capable of tunable single frequency operation are highly desirable. One area of application that illustrates the need for such capability is spectroscopy. Although not all spectroscopic applications require single frequency operation, the narrower the absorption line of a molecular or atomic species, a test subject, the greater the need that the spectral width of an output of a light source be narrow to detect the absorption line.

In spectroscopy, the amount of light absorbed by a test subject is recorded as a function of wavenumber, the frequency of a wave divided by its velocity of propagation (the reciprocal of wavelength) resulting in a lineshape or absorption line. Spectroscopy is often used to identify substances by their known absorption lines. Absorption lines vary with environmental parameters. For example, a decrease in pressure will narrow the absorption line of a known species such as water vapor. In spectroscopic applications, light source wavelength, tuning range and spectral quality are important.

A light source whose wavelength may be tuned over a wide range is desirable so that it may be used to detect absorption lines at a broader range of wavelengths. For some applications, single frequency operation is highly desirable, if not required, in order to detect substances with narrow bandwidth absorption lines. Such an application would be measuring water vapor on Mars, in particular obtaining short range, meaning a few kilometers, resolved planetary atmospheric profiles using an active spectrometer at the heart of a water vapor lidar instrument. There is no atmospheric pressure on Mars. This causes the absorption line of water vapor on Mars to be within a much narrower bandwidth than on Earth where the atmospheric pressure tends to spread the absorption line of water vapor. A spectrometer capable of single frequency operation is desirable because the narrow line of the light source of such a spectrometer can be tuned to within the narrower band of wavenumbers comprising the absorption line of water vapor on Mars and detect it. Without single frequency operation, the spectrum of the light output of the spectrometer may be spread too broadly to accurately detect the presence of water vapor resulting in an inaccurate atmospheric water vapor profile on Mars.

Compactness, low power consumption, high accuracy of determining constituent content, and low-cost are all desirable features in a spectrometer also. Laser based spectrometers have used tunable dye lasers, titanium sapphire lasers, and laser diodes as their light sources. Tunable dye lasers and titanium sapphire lasers are typically bulky, inefficient and expensive. Advanced manufacturing machinery for epitaxial growth has enabled the mass production of semiconductor lasers and light emitting diodes (LEDs) throughout the visible and near infrared portion of the optical spectrum. These devices have proved to be low-cost, operable at room temperature, reliable devices providing a diversity of available wavelengths. However, previous use of diode lasers in active spectrometers without fiber grating feedback have shown the difficulty in obtaining single frequency operation due to the multimode operation of laser diodes and their temperature sensitivity causing wavelength instability. The multimode behavior of diode lasers such as Fabry-Perot diode lasers in the GaAs family is not conducive to stability and wavelength reproducibility desirable in a spectrometer. Moreover, laser diodes emit a rapidly diverging beam which produces an astigmatism in its light output. As a consequence of the astigmatism, coupling geometries that accommodate the transverse numerical aperture of the laser are defocused in the lateral dimension, even for aspherical optics. The mismatch produces a quadratic phase variation in the feedback along the lateral axis at the facet of the laser that excites lateral modes of higher order than the single longitudinal mode, $TM_{00}$.

To obtain single frequency operation, two types of diode lasers with a grating incorporated in the semiconductor structure have been developed. One such type is the Distributed Feedback (DFB) laser which has the grating adjacent to the active region of the diode where current flows. The manufacturing process of this type of laser results in narrower wavelength dispersion than in multimode Fabry-Perot lasers. Another type is the Distributed Bragg Reflection (DBR) lasers in which the grating is in the passive part of its cavity where no current flows. The fact that the grating is incorporated in the semiconductor structure requires custom manufacturing for specific applications. Custom wavelength DFB or DBR lasers are still very expensive, costing more than $100,000. Furthermore, single frequency operation is still limited in these lasers due to sensitivity to temperature fluctuations.

Commercial laser diodes have been placed in external cavities with bulk gratings enabling a wide tuning range and wavelength control. Bulk grating external cavity laser diode systems have been optimized and are commercially available. The drawbacks of these systems include that they are still reasonably expensive, greater than five thousand dollars ($5000), and are physically too large to incorporate into many possible tunable diode laser based products in which compactness is highly desirable.

As illustrated by the spectroscopy example, low-cost fiber grating coupled light sources, such as light emitting diodes, Fabry-Perot laser diodes, and optical amplifiers, capable of single frequency operation, or at least operation within a narrow optical spectral width of the desired wavelength are highly desirable.

SUMMARY

It is an object of the present invention to provide a low-cost fiber grating coupled light source capable of tunable, single frequency operation.

More specifically, it is an object of the present invention to provide a light source apparatus comprising a quasi-monochromatic light source, optically coupled to a fiber optic waveguide, having a Bragg grating written into a portion of the waveguide; said grating having a center wavelength, said grating providing optical feedback to the light source; said light source having an axial mode, lateral submodes and a lateral submode spacing; said axial mode having a wavelength; the optical feedback of the grating pulling the axial mode wavelength to the center wavelength of the grating; a refractive index controller for controlling a refractive index of the quasi-monochromatic light source so that the axial mode wavelength coincides with the center wavelength of the grating; and a lateral submode suppresser for influencing the optical feedback of the grating to the light source so that a single frequency output of the light source apparatus results.

In one embodiment of the present invention the lateral submode suppresser comprises a lateral aperture stop; a first collimator for collimating the axial mode wavelength of the quasi-monochromatic light source, said first collimator optically aligned between the light source and said lateral aperture stop; and a second collimator optically aligned between said lateral aperture stop and the fiber optic waveguide for collimating the optical feedback of the grating.

In one embodiment, the lateral aperture stop is a variable width slit. In another, it is a lateral aspherizing plate. In yet another, the lateral submode suppresser is the grating having a bandwidth less than the lateral submode spacing of the quasi-monochromatic light source.

It is another object of the present invention to provide a light source apparatus comprising a quasi-monochromatic light source, optically coupled to a fiber optic waveguide, having a Bragg grating written into a portion of the waveguide; said grating having a passband of wavelengths and a tunable center wavelength, a wavelength tuning mechanism being applied to said grating to obtain a tuned center wavelength, said grating providing optical feedback to the light source; said light source having an axial mode, lateral submodes and a lateral submode spacing; said axial mode having a wavelength; the optical feedback of the grating pulling the axial mode wavelength to the tuned center wavelength of the grating; a refractive index controller for controlling a refractive index of the quasi-monochromatic light source so that the axial mode wavelength coincides with the tuned center wavelength of the grating; and a lateral submode suppresser for influencing the optical feedback of the grating to the light source so that a single frequency output of the light source apparatus results.

It is another object of the present invention to provide a light source apparatus comprising: a Fabry-Perot laser diode, optically coupled to a fiber optic waveguide, having a Bragg grating written into a portion of the waveguide; said grating having a passband of wavelengths and a tunable center wavelength, a wavelength tuning mechanism being applied to said grating to obtain a tuned center wavelength, said grating providing optical feedback to the laser diode; said laser diode having an axial mode, lateral submodes and a lateral submode spacing; said axial mode having a wavelength; the optical feedback of the grating pulling the axial mode wavelength to the tuned center wavelength of the grating; a refractive index controller for controlling a refractive index of the laser diode so that the axial mode wavelength coincides with the tuned center wavelength of the grating; and a lateral submode suppresser for influencing the optical feedback of the grating to the light source so that a single frequency output of the light source apparatus results.

It is another object of the present invention to provide a spectrometer that comprises a fiber grating coupled light source capable of single frequency operation.

It is an object of the present invention to provide a spectrometer apparatus comprising a fiber grating coupled transmitter optically coupled to a test subject that is optically coupled to an optical detector. The fiber grating coupled transmitter comprises a quasi-monochromatic light source, optically coupled to a fiber optic waveguide, having a grating written into a portion of the waveguide, said grating having a passband of wavelengths and a tunable center wavelength. The transmitter further comprises a wavelength tuning mechanism being applied to the grating for tuning the center wavelength, said grating providing optical feedback to the light source so that a wavelength of the light source is tuned to within a narrow optical spectral width of the center wavelength resulting in a tuned wavelength from the transmitter.

BRIEF DESCRIPTION OF THE DRAWINGS

These and other features, aspects, and advantages of the present invention will become better understood with regard to the following description, appended claims, and accompanying drawings where:

DETAILED DESCRIPTION

Figure 1:
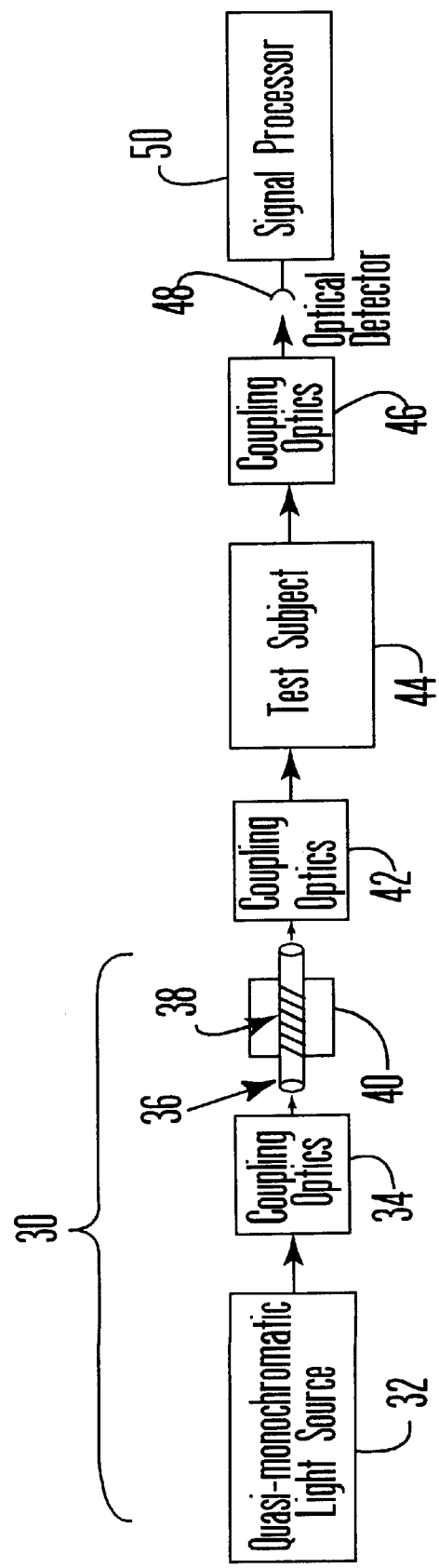
FIG. 1 shows a block diagram of the elements of an embodiment of a spectrometer using fiber optic grating feedback.

FIG. 1 shows a block diagram of an embodiment of a spectrometer comprising a fiber grating coupled (FGC) transmitter (30) optically coupled to a test subject (44) which in turn is optically coupled to an optical detector (48). The fiber grating coupled transmitter comprises a quasi-monochromatic light source (32) optically coupled to a fiber optic waveguide (36) having a grating (38) written into a portion of the waveguide. The grating could be any type of fiber grating. A specific example would be a sampled fiber Bragg grating which is a grating in which the amplitude or phase is modulated along the grating by a sampling function. Such a grating is described in "Broadly tunable DBR fibre laser using sampled fibre Bragg gratings" M. Ibsen, B. J. Eggleton, M. G. Sceats and F. Ouellette, Electronics Letters Jan. 5, 1995 Vol. 31 No. 1, hereby incorporated by reference.

A quasi-monochromatic light source (32) produces light in a narrow range of wavelengths. An example of such a range is approximately less than fifty (50) nanometers. Semiconductor laser diodes, light emitting diodes, semiconductor optical amplifiers, fiber optic lasers, and fiber optic amplifiers are examples of quasi-monochromatic light sources. Light emitted from the light source (32) is then optically coupled by coupling optics (34) into a fiber optic waveguide (36) having a fiber grating (38) written in a portion of the waveguide. Examples of coupling optics are a lens and a free space butt couple.

The grating has a passband of wavelengths, one of which is tunable to a center wavelength. The fiber grating selects a single wavelength or a very narrow range of wavelengths (typically<0.2 nm) from the quasi-monochromatic light source. When the quasi-monochromatic light source is a laser diode, semiconductor laser amplifier, fiber optic laser or fiber optic amplifier, the grating is selected with a reflectivity which is high enough such that the light reflected from the fiber grating back to the light source, optical feedback, influences the quasi-monochromatic light source spectrum. The optical feedback provided by the grating causes a wavelength of the light source to be tuned to within a narrow optical spectral width of the center wavelength of the grating. The result is a tuned wavelength from the transmitter.

Figure 16:
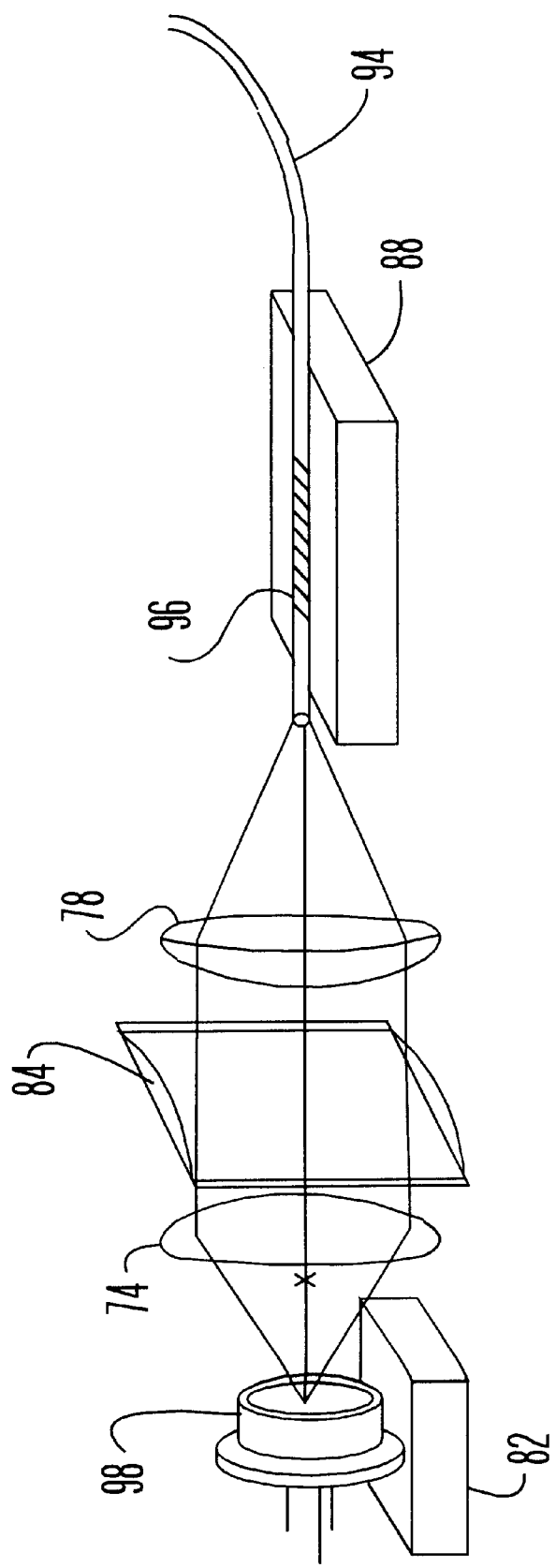
FIG. 16 shows an embodiment of a light source apparatus using a lateral aspherizing plate as the aperture stop.

A wavelength tuning mechanism (40) is applied to the grating for tuning the center wavelength. There are various techniques for wavelength tuning a fiber optic grating. Temperature changes will change the wavelength. If temperature tuning is to be used, the wavelength tuning mechanism is a temperature controller which controls the heat applied to the grating. One such embodiment would be a thermoelectric cooler to which a copper block with an imbedded thermistor is mounted. The grating portion of the fiber may then be mounted to the copper block. Another method is compression tuning. This method and a wavelength tuning mechanism for accomplishing it have been described in U.S. Pat. No. 5,469,520 entitled "Compression-Tuned Fiber Grating," to Morey et al., hereby incorporated by reference. Another method of wavelength tuning is applying stress or strain along the longitudinal length of the optical fiber. In one embodiment, this may be accomplished by the use of a piezo-electric strain-tuning stage (88) on which the fiber grating is cemented as the wavelength tuning mechanism as shown in FIG. 16. Electrical (see "Electrically Tunable Singlemode Fiber Bragg Reflective Filter", Lin X. Z., Zhang Y., An H. L., Liu H. D., Electronic Letters Vol. 30, No. 11, May 26, 1994 (p. 887–888, hereby incorporated by reference), and magnetic wavelength tuning (see "Fiber Bragg Gratings Tuned and Chirped Using Magnetic-Fields," Cruz J. L., Diez A., Andres M. V., Segura A., Ortega B., Dong L., Electronic Letters, Vol. 33, No. 3, Jan. 30, 1997, pp. 235–236, hereby incorporated by reference), have also been demonstrated.

FIG. 1 shows a second set of coupling optics (42) which couples the light from the fiber to the test subject (44). Again the coupling optics may include a lens or may simply be free space. The test subject (44) may be a planetary atmosphere, blood or any other gas, liquid or solid substance that is desired to be spectrally analyzed by in-situ, remote or non-invasive spectroscopy. The resultant light from the test subject, whether it be transmitted, reflected or scattered, is coupled via coupling optics (46) to an optical detector (48) thereby providing a received light signal. The optical detector (48) converts the received light signal into an electrical signal which is sent to a signal processor (50). For example, the optical detector may produce an electrical signal whose amplitude is proportional to the amplitude of the received light signal. The signal processor may be hardware, software or some combination thereof which processes the electrical signal to obtain information such as chemical constituents or amounts of chemical constituents in the test subject being analyzed.

Figure 2:
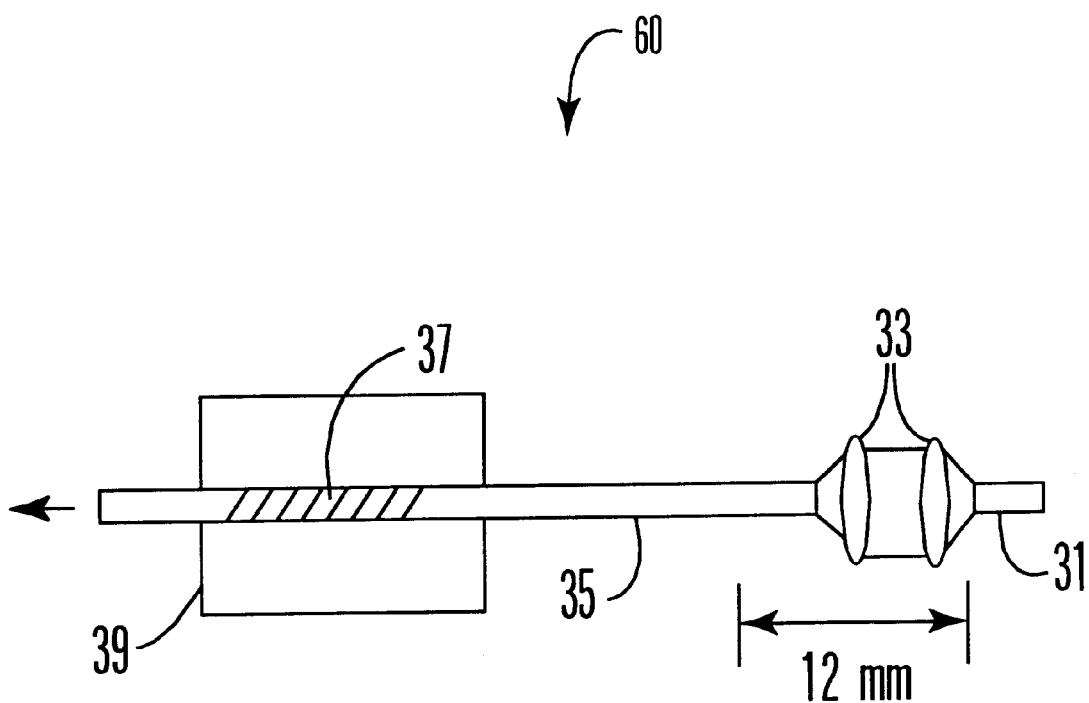
FIG. 2 shows an embodiment of a fiber grating coupled laser transmitter.

FIG. 2 shows an embodiment of a fiber grating coupled transmitter (60) that was used to measure atmospheric water vapor. The 935 nm to 950 nm range was used due to the strong water vapor absorption lines in this region. The transmitter comprises a Fabry-Perot InGaAs laser diode (31) with multiple longitudinal modes and a room temperature (25C) wavelength of 938 nm and a fiber optic waveguide (35) with a seven percent (7%) reflectivity permanent grating (37) written into it with a passband centered around the 935 nm wavelength. When light from the laser diode is coupled via lenses (33) into the fiber waveguide (35), the light reflected from the grating (37) acts as optical feedback that "pulls", meaning reinforces an axial mode of the laser diode to the 935 nm grating center wavelength and greatly reduces the optical spectral width of the laser. In this embodiment, the wavelength tuning mechanism is a heater (39) comprising a custom mechanical fixture of copper, in which the fiber was mounted. The fixture was mounted on a thermoelectric cooler/heater. Temperature tuning allows coarse wavelength tuning of the fiber grating center wavelength with temperature. The particular grating used in this embodiment was a 3M Inc. 935 nm fiber grating with a temperature tuning range of (10 pm/C).

Figure 3:
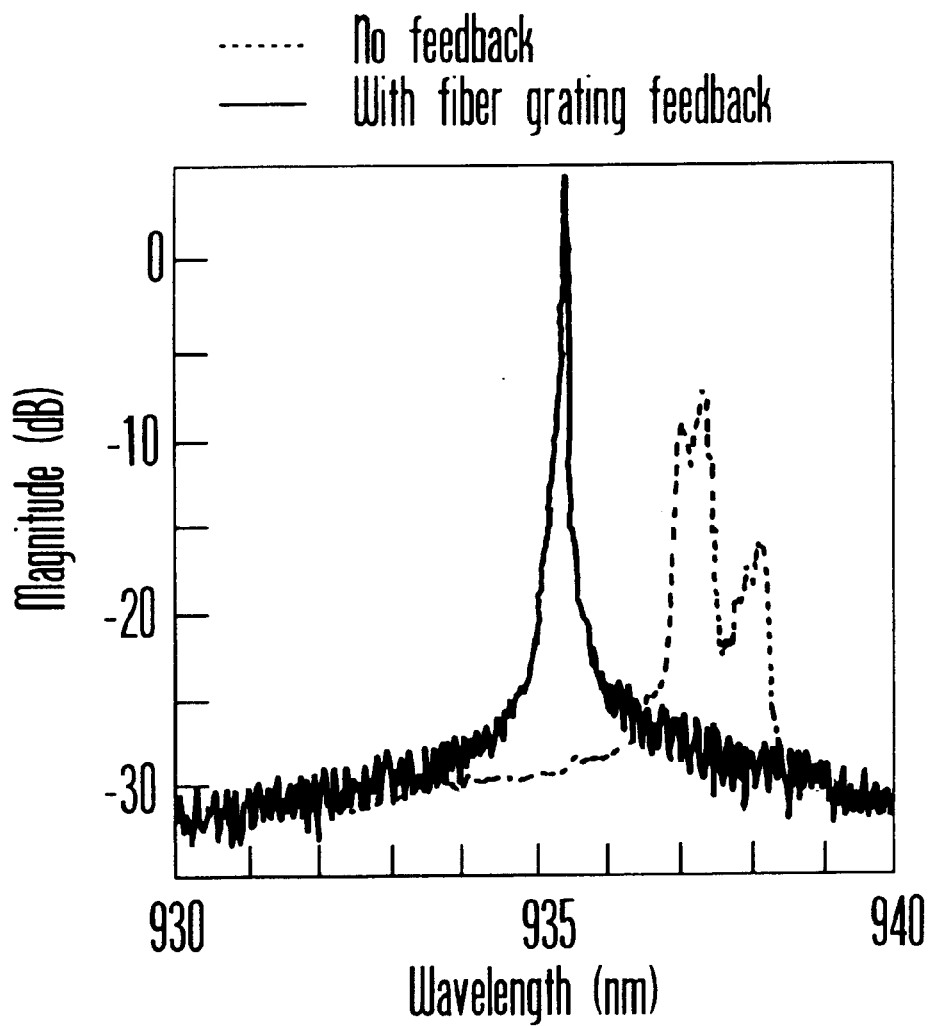
FIG. 3 shows an optical power versus wavelength plot comparing a laser diode spectrum without fiber grating feedback and the spectrum of the embodiment of FIG. 2 which uses fiber grating feedback.
Figure 11A:
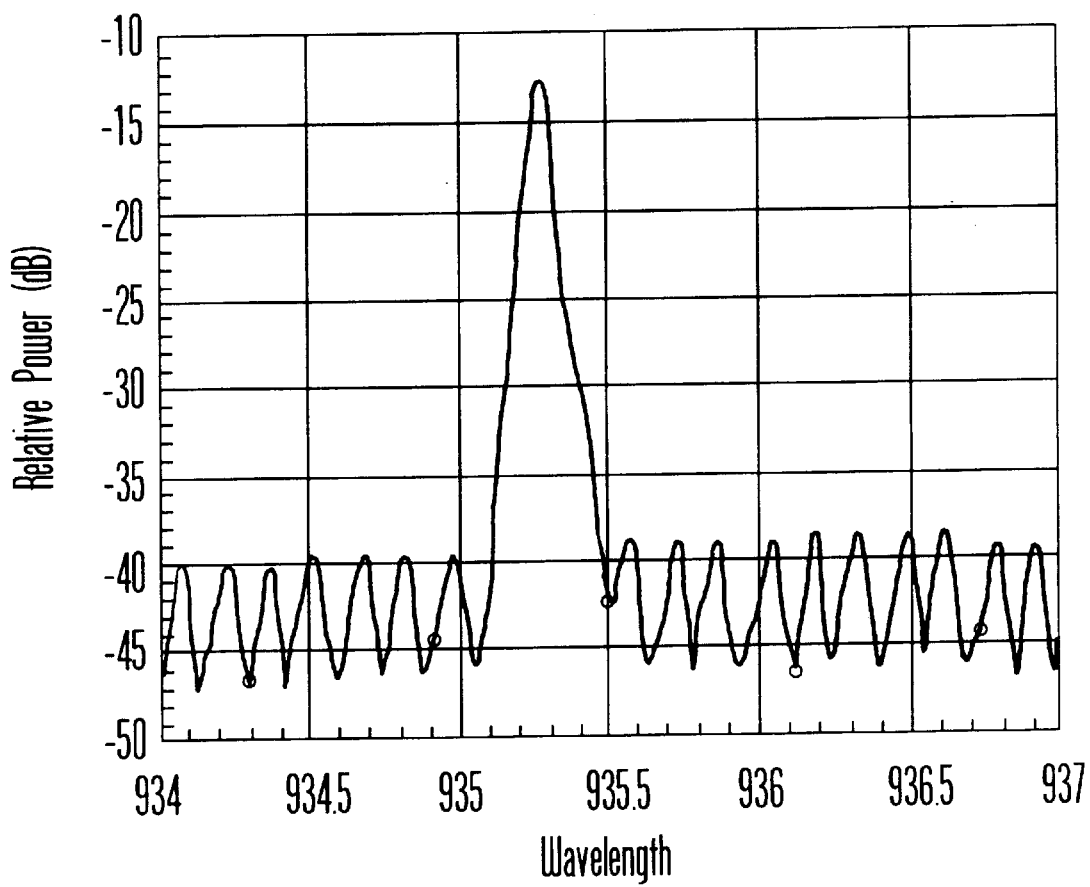
FIG. 11A shows an output spectrum of a Fabry-Perot diode laser stabilized by a Bragg Grating, the spectrum of which was shown in FIG. 10.
Figure 11B:
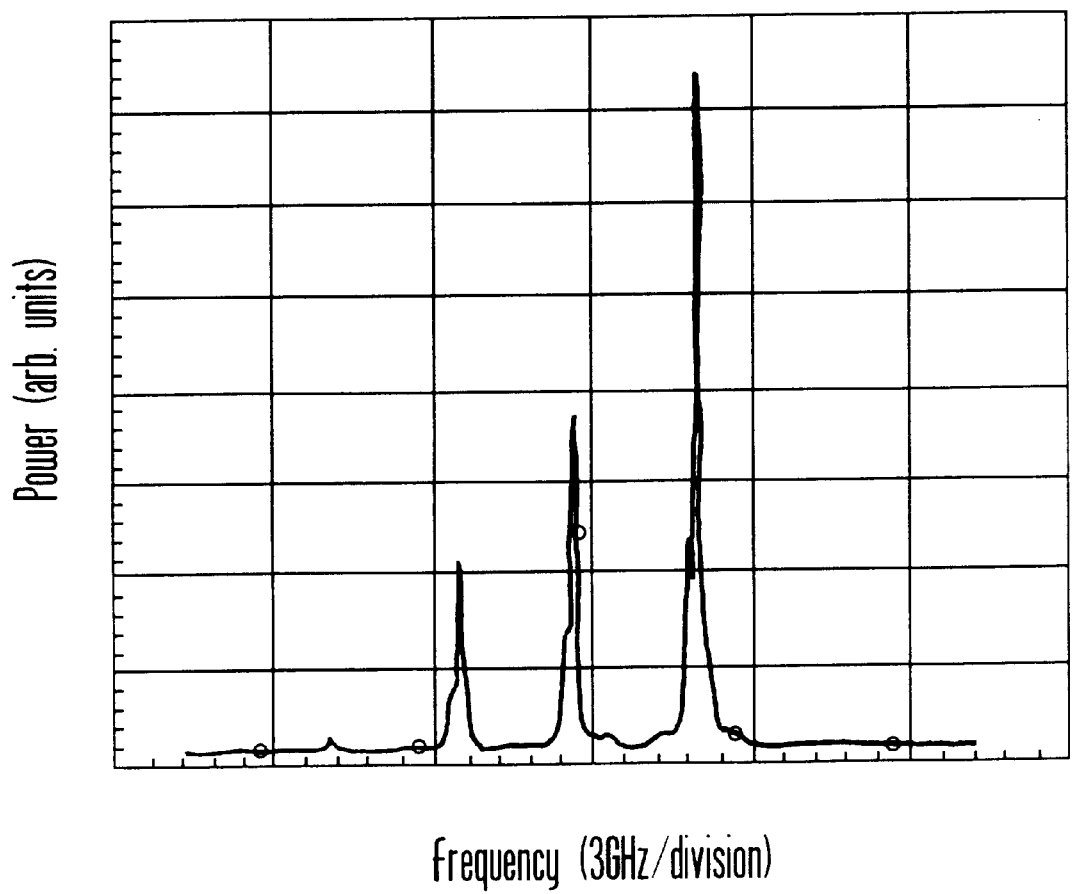
FIG. 11B shows lateral submodes in the spectrum of the grating stabilized diode laser of FIG. 11A when the spectrum of the laser diode was scanned with a scanning Fabry-Perot etalon.

FIG. 3 compares the spectrum of the laser diode (31) from FIG. 2 with and without fiber grating feedback as measured by an Ando Model AQ 1425 Optical Spectrum Analyzer. Two undesired properties of the laser diode spectrum without fiber optic grating feedback are observed from FIG. 3. (1) It is multimode, and (2) the center wavelength is ~938 nm at room temperature (25 C). The laser diode wavelength tunes approximately 0.3 nm/C. One embodiment of a temperature controller thermally coupled to a laser diode for temperature tuning it would be that the diode be mounted on a thermoelectric cooler (See FIG. 16). The laser would have to be operated at ~15 C (near the dew point) in order to achieve the desired 935 nm wavelength and the laser would still be multimode. Both of these problems are alleviated by using the fiber optic grating. The fiber optic grating used to obtain the laser diode spectra with fiber grating feedback had a center wavelength of 935.4 nm (vacuum wavelength) at 25 C, a bandpass of ~0.1 nm and 7% reflectivity. FIG. 3 shows that the fiber optic grating feedback pulls the wavelength of an axial mode wavelength of the laser diode to within a narrow optical spectral width of the grating's center wavelength at room temperature (25C). As will be discussed later, if measured with a more precise spectrum analyzer, the narrow linewidth of a fiber grating feedback coupled laser diode may have submodes as shown in FIG. 11B.

Figure 4:
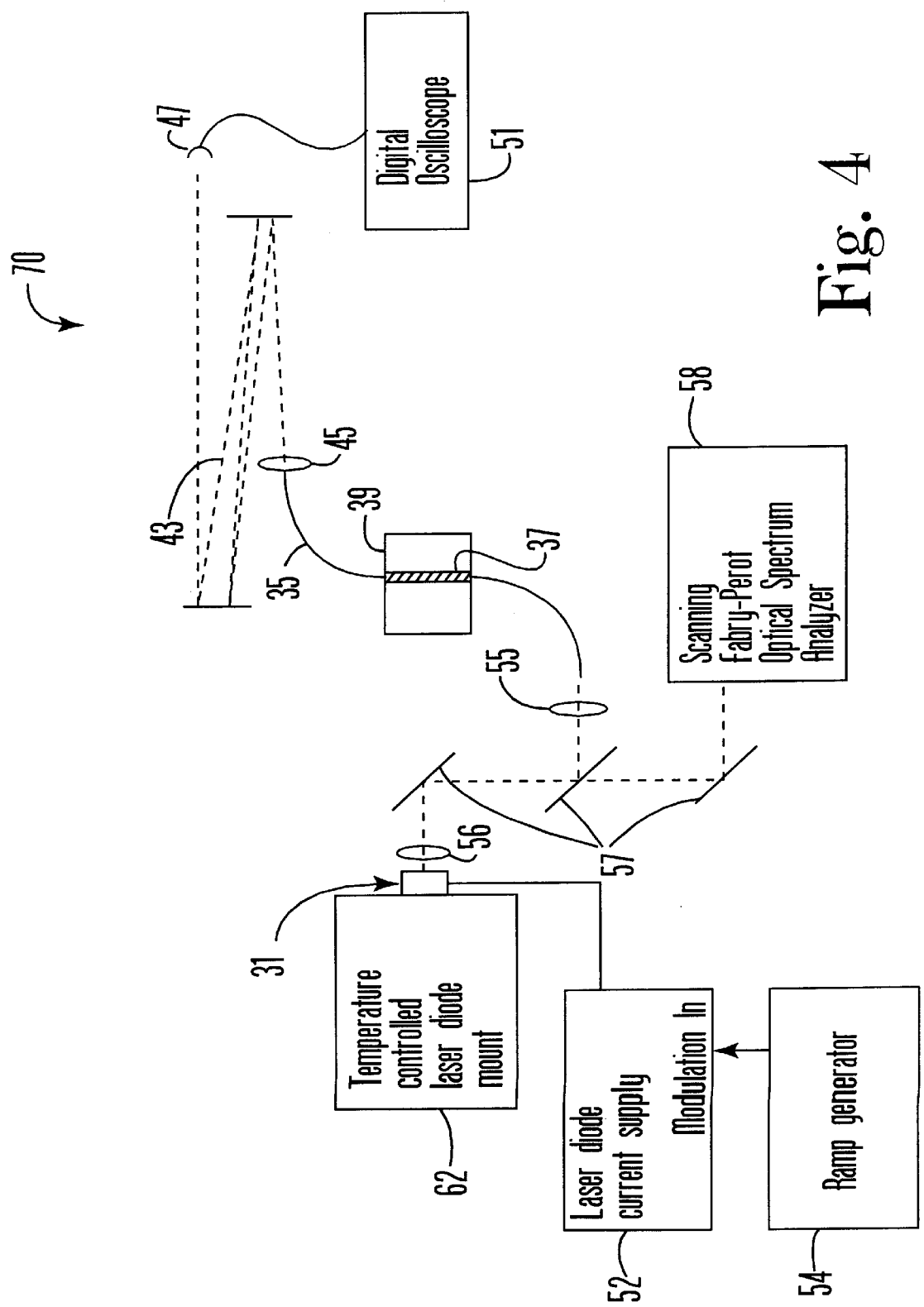
FIG. 4 shows an Experimental Set-Up for Atmospheric Water Vapor Measurement using 935 nm Fiber Grating Coupled Transmitter.
Figure 17:
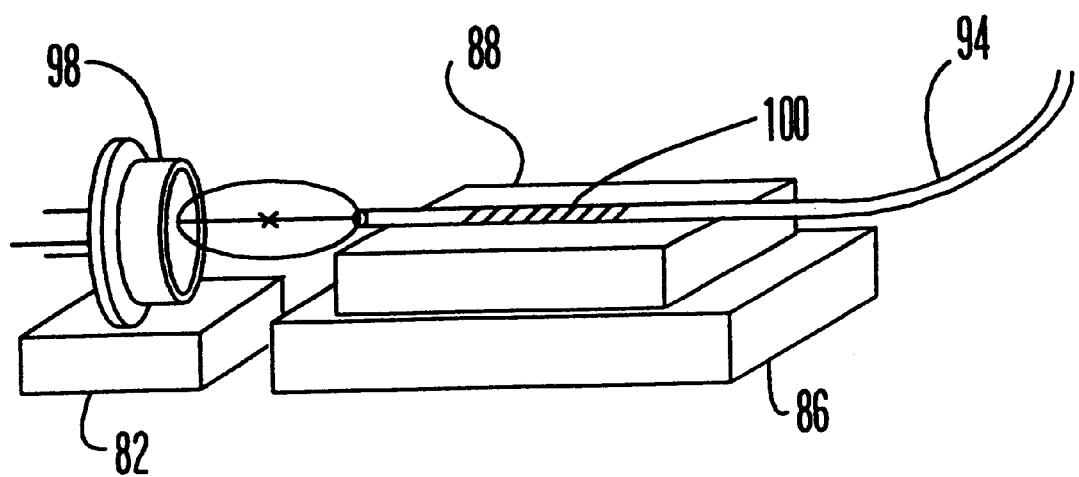
FIG. 17 shows an embodiment of a light source apparatus wherein an ultra-narrow bandwidth lensed fiber Bragg grating is used as a lateral submode suppresser.

The FGC transmitter of FIG. 2 was used to make real time measurements of atmospheric water vapor as follows. FIG. 4 shows an embodiment of the invention used for an experimental set-up (70) for atmospheric water vapor measurement using the 935 nm fiber grating coupled laser diode transmitter. The Fabry-Perot InGaAs laser diode produced 50 mW of optical power (diode alone). This light was optically coupled using two lenses (56) and (55), at least one of which was an aspherical collimating lens (56), and mirrors (57) into the fiber optic waveguide (35) having the 935 nm fiber grating (37) and measured 8 mW at the output. A temperature controller for controlling the temperature of the laser diode is shown as a temperature controlled laser diode mount (62). For example, the laser diode may be mounted on a thermoelectric cooler (82) as shown in FIGS. 16 and 17. A current controller for controlling a current to the laser diode is also used. The embodiment shown in FIG. 4 comprises a laser diode current supply (52) which provided a current, sometimes referred to as a bias, operating or drive current, to the laser diode, the current supply (52) having been modulated. Modulation was accomplished in the experiment with a sawtooth waveform created by a ramp generator (54) which, in the embodiment used for this experiment, was an electrical function generator (Tektronix Model PFG 5105). This modulated the intensity and the wavelength of the laser diode (31). Both the temperature controller and current controller can act as refractive index controllers for controlling a refractive index of a quasi-monochromatic light source such as a laser diode.

The laser diode peak to peak modulation current was 40 mA. For example, with the laser diode bias current set to 40 mA the laser diode current varied linearly between 20 mA and 60 mA. This served to modulate the wavelength in accordance with the data shown in FIG. 5C. At a fixed fiber grating temperature and a fixed laser diode temperature, there is a one to one correspondence between the laser diode bias current values and laser wavelength. The laser optical spectra was monitored with a scanning Fabry-Perot Optical Spectrum Analyzer (58) to insure that the laser maintained narrow laser spectral width operation as the current was modulated. To insure narrow laser spectral width operation, the modulation rate was kept low (1 Hz). The output of the FGC laser was allowed to propagate across a test subject of a 16 m atmospheric path (laboratory open air) (43). The resultant light signal from the 16 m path was focused on an optical detector (47), which in this embodiment was a PIN diode which was connected to a signal processor, in this case, a digital oscilloscope (51). When the laser wavelength was far off the water vapor absorption peak (at low fiber grating temperature: 25 C), the detected intensity was measured as linear. The fiber grating temperature was then set to 54 C. At these settings (fiber grating temperature: 54 C, laser diode temperature: 17.4 C) the laser wavelength is scanned through the water vapor absorption peak as the laser current is modulated. By adjusting the laser diode bias current, the start and stop points of the wavelength scan are changed while the wavelength span is kept the same. (This also changes the range of laser intensities due to the ramp waveform).

Figure 5A:
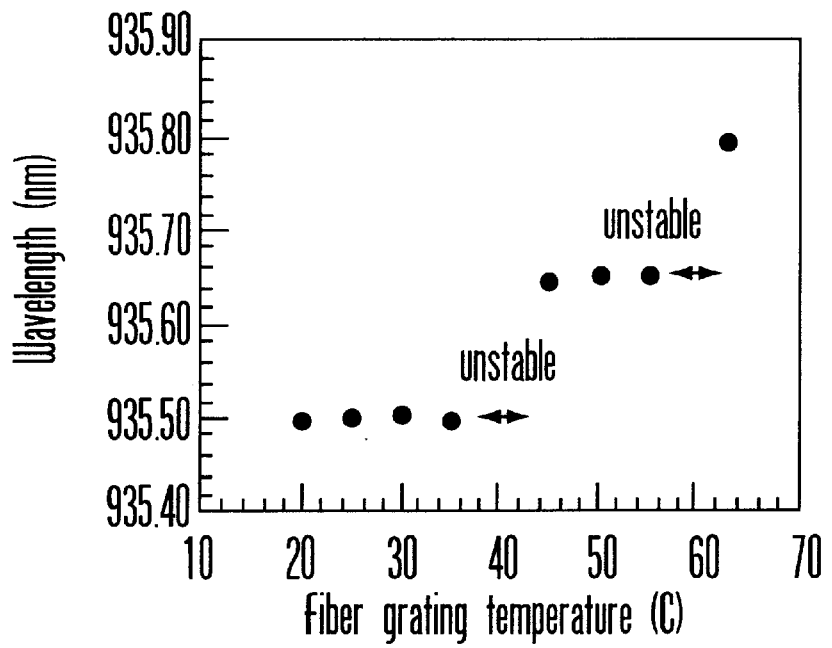
FIG. 5A shows a Wavelength vs. Fiber grating temperature plot for the embodiment in FIG. 2 when the fiber grating wavelength is tuned with temperature while the laser diode temperature and bias current are maintained at particular values.
Figure 5B:
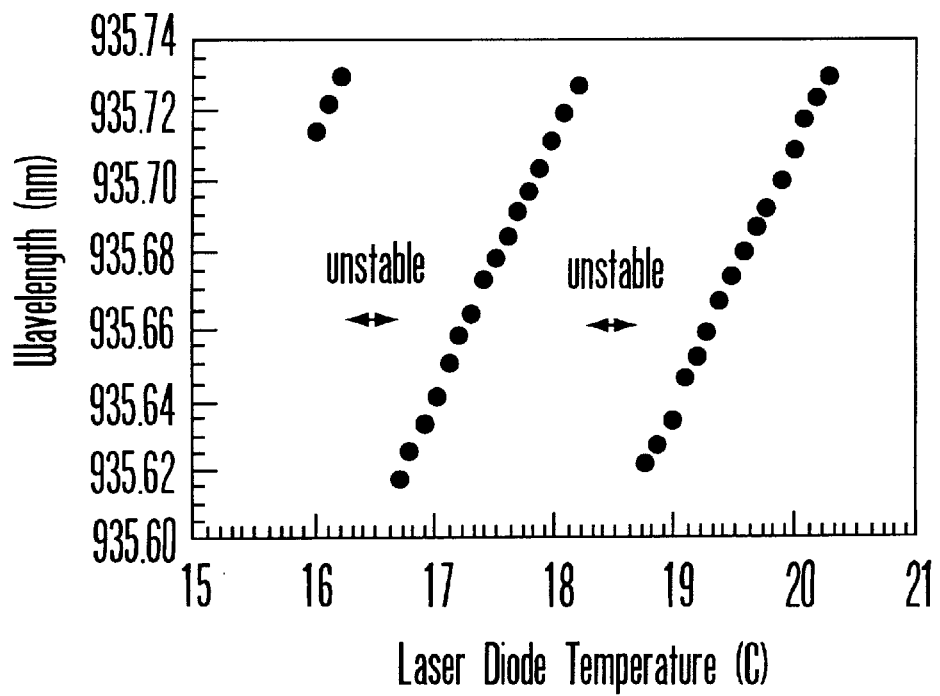
FIG. 5B shows a Wavelength vs. Laser diode temperature plot for the embodiment in FIG. 2 when the laser diode wavelength is tuned with temperature while the fiber grating temperature and laser diode bias current are maintained at particular values.
Figure 5C:
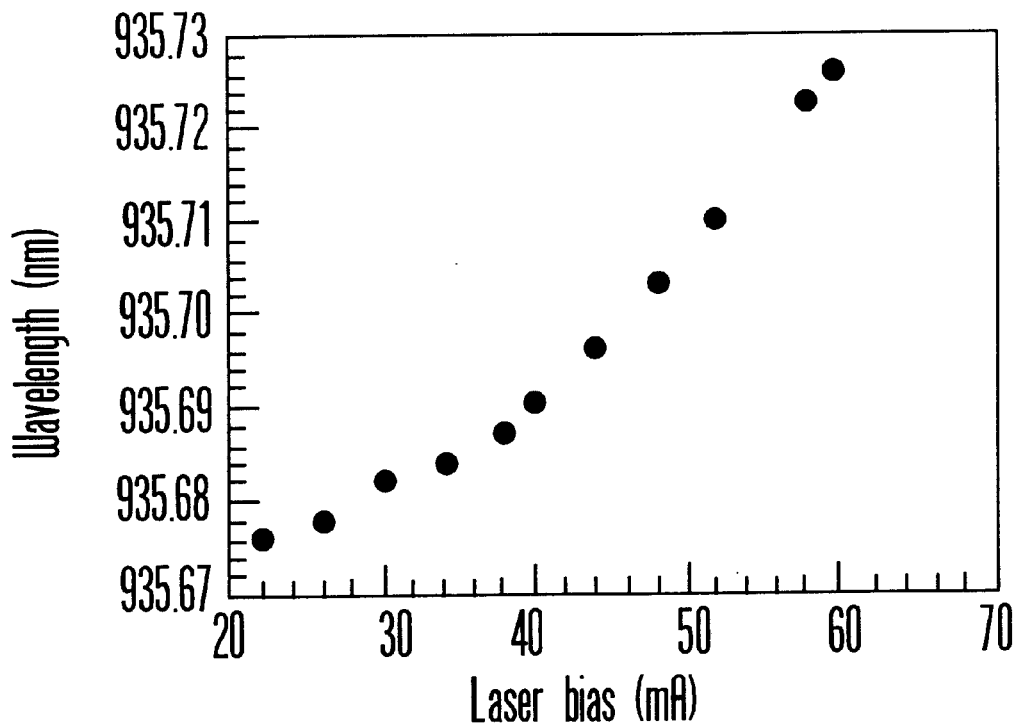
FIG. 5C shows a Wavelength vs. Laser bias current plot for the embodiment in FIG. 2 when the laser diode wavelength is fine tuned by modulating a bias current to it while the fiber grating temperature and laser diode temperature are maintained at particular values.

FIG. 5A shows the tuning of the fiber grating coupled laser transmitter as a function of the fiber grating temperature with a fixed laser diode current of 35 mA and a laser diode temperature of 17.4 C. Although the fiber grating tunes with temperature, it does not provide continuous tuning with temperature. There are discontinuities representing regions of instability. FIG. 5B shows the tuning of the FGC transmitter as a function of the laser diode temperature with a fixed fiber grating temperature (54 C) and fixed laser diode bias current (40 mA). FIG. 5C shows the tuning of the laser transmitter as a function of the laser diode bias current with a fixed fiber grating temperature (54 C) and fixed laser diode temperature (17.4 C). Under these conditions, it is shown that continuous tuning occurs over the range shown.

The data in FIGS. 5A, 5B and 5C was measured with the Burleigh Model WA 1500 Wavemeter (0.1 pm resolution). From FIG. 5B, we see that the fiber grating spectral passband is: 935.73–935.62=0.11 nm. The transmitter exhibits unstable operation in the regions of discontinuity in FIG. 5B (i.e. from 16.3 to 16.6 C and from 18.3 to 18.7 C). From FIGS. 5A, 5B and 5C, it is shown that it is possible to tune the transmitter to any specific wavelength within the fiber grating passband. The center wavelength of the fiber grating passband is determined by the fiber grating temperature. The specific wavelength is then further determined by the laser diode temperature and current. Certain unstable regions exist at the edges of the fiber grating passband. These can be accessed by tuning the fiber grating. Therefore it is possible to tune the laser transmitter to any specific wavelength in the 935.5 to 935.8 nm range.

Figure 6:
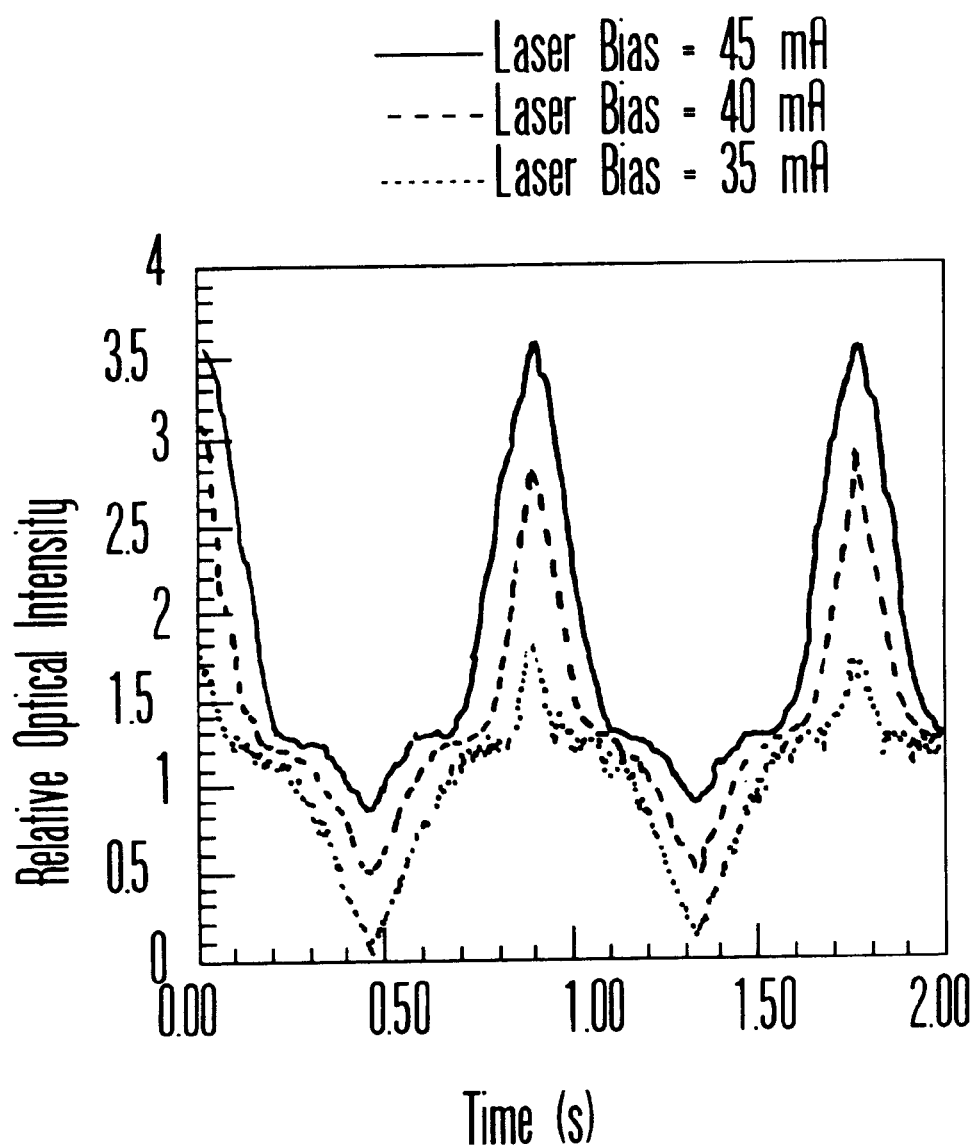
FIG. 6 shows the plot of Relative Optical Intensity versus Time (seconds) for outputs at an Optical Detector from Three Different Trials of the Water Vapor Experiment at three different bias currents.

The optical detector output is shown in FIG. 6 for three different laser diode bias currents (35, 40 and 45 mA). The drop in intensity (minima) due to the water vapor absorption is seen to remain at the same optical intensity indicating the same laser current value indicating the same wavelength. This is an expected result for a molecular absorption peak (i.e. it occurs at a specific absolute wavelength).

Figure 7:
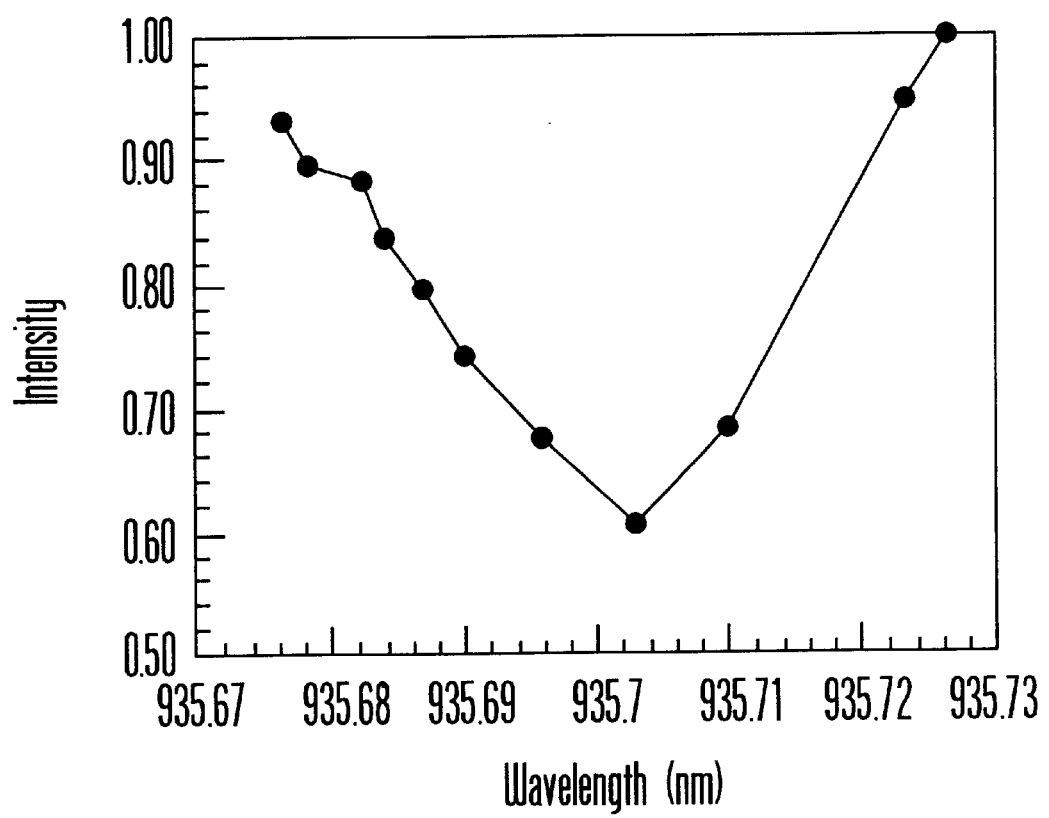
FIG. 7 shows a plot of Intensity (Normalized) versus Wavelength for the Measured water vapor absorption from the sixteen meter atmospheric path of the Experimental Set-Up in FIG. 5 at a bias current of 40 mA.

FIG. 7 shows the measured water vapor absorption from the 16 m atmospheric path using data obtained when the laser diode bias current=40 mA. (See FIG. 6). The resulting atmospheric water vapor transmission (and hence absorption) curve as shown is in agreement with HITRAN data.

Figure 8:
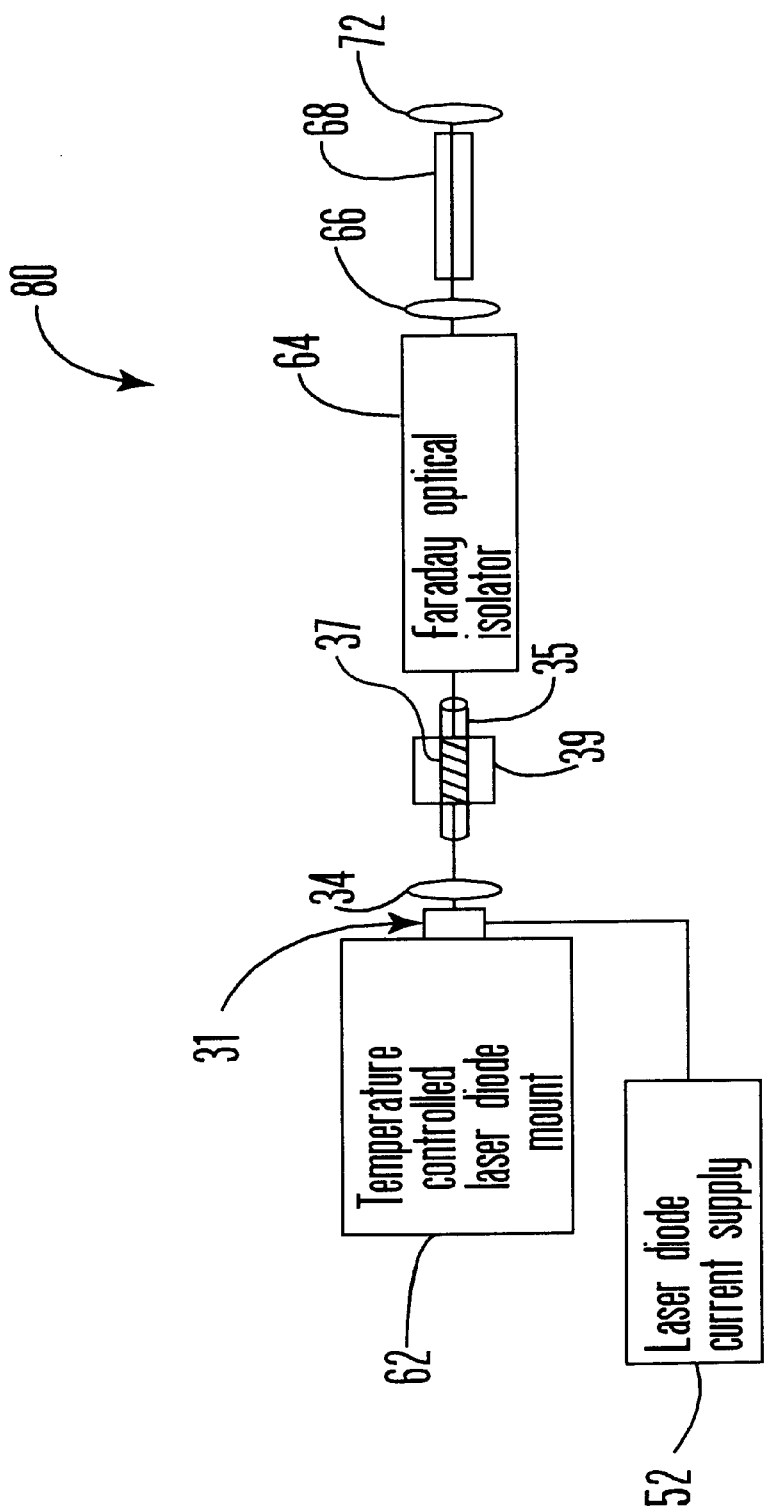
FIG. 8 shows an embodiment of the invention in which the laser transmitter comprises a fiber grating coupled laser diode seeding an optical amplifier in a master oscillator power amplifier configuration.

Continuous operation of the transmitter through the passband wavelenths by current modulation of a laser diode can be improved by the addition of an optical amplifier (68) as shown in FIG. 8. On the setup shown in FIG. 8, the fiber grating coupled transmitter is in a master oscillator power amplifier (MOPA) configuration (80). This configuration provides high power with an improved signal to noise ratio. FIG. 5C showed that the fiber grating coupled transmitter could be tuned in wavelength by changing the bias current of the laser diode as provided by the laser diode current supply (52). However, the transmitter output power also changes as a function of the laser current. Additional noise is produced by the amplitude modulation of the power fluctuation of the laser diode. This modulation of the output power can be seen in FIG. 6 with the molecular absorption spectral feature (water vapor absorption line) superimposed on it. To extract the molecular absorption spectral feature as shown in FIG. 7, a ratio is taken as follows: Pdet/Pcal, where Pdet is the optical power as a function of time detected after passing through (or reflecting from) the test subject, and Pcal is the optical power vs. time before passing through the test subject.

Figure 9:
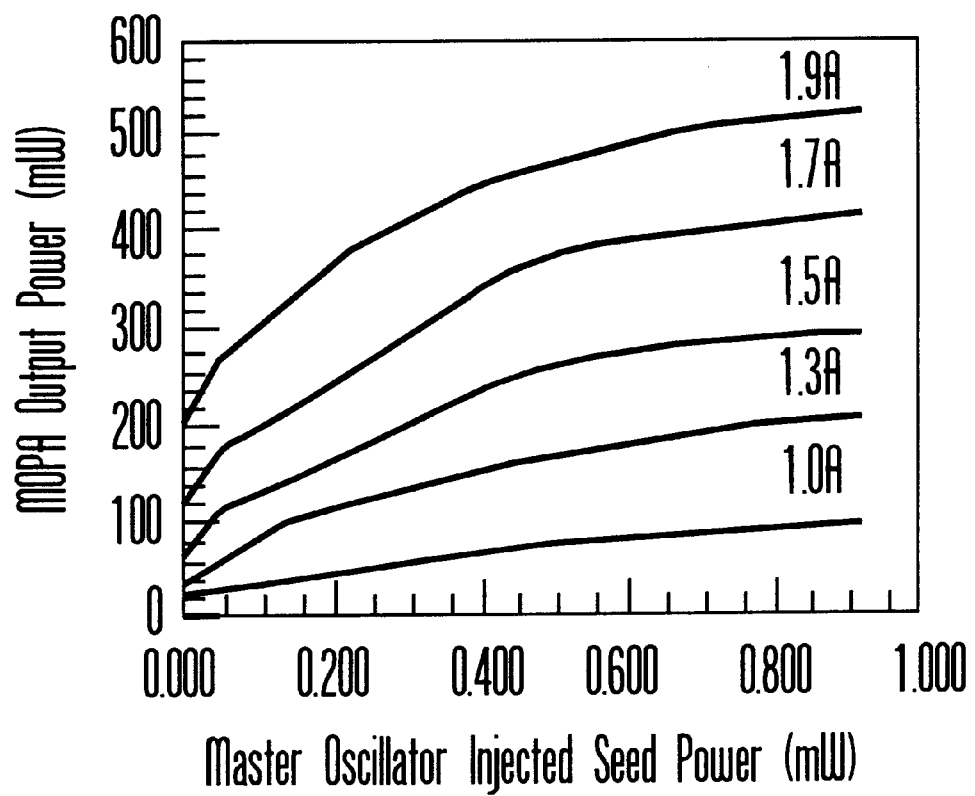
FIG. 9 shows a typical Master Oscillator Power Amplifier Continuous Wave Output Power vs. Injected Seed Power for Various Amplifier Currents.

As FIG. 9 shows, since the optical amplifier saturates, the output power of the fiber grating based MOPA transmitter will remain at a constant level even while the laser diode is tuned in wavelength by changing the bias current to the laser diode. This would eliminate the need to take any ratios and allows the spectral feature to be detected directly from the light detected which passed through or reflected from the test subject. FIG. 9 shows a typical optical amplifier plot of output power vs. injected seed power for various amplifier currents. Typical optical amplifiers are semiconductor optical amplifiers such as an InGaAs flared amplifier. An optical isolator such as the Faraday optical isolator (64) may also be used. (66) and (72) are coupling optics, examples of which are lenses and free space. (34) is also coupling optics as denoted in FIG. 1 for coupling a quasi-monochromatic light source such as a Fabry-Perot Diode Laser to a fiber optic waveguide.

As previously noted, FIG. 11B shows that the optical spectrum of a quasi-monochromatic light source coupled to a fiber grating may exhibit submodes when measured on a finer scale. The next set of figures are particularly pertinent to explaining the apparatus for obtaining single frequency operation for a quasi-monochromatic light source. The light source used to obtain the data was a Fabry-Perot laser diode. A short overall description preceding the detailed description of the figures is provided first.

Short Description:

The output from a Fabry Perot diode laser can be stabilized to a narrow spectral range using feedback from a Fiber Bragg grating; the resulting spectrum is not single frequency (single axial and lateral spatial mode), however, because the output of the laser diode is astigmatic. As a consequence of the astigmatism, coupling geometries that accommodate the transverse numerical aperture of the laser are defocused in the lateral dimension, even for apsherical optics. The mismatch produces a quadratic phase variation in the feedback along the lateral axis at the facet of the laser that excites lateral modes of higher order than the $TM_{00}$.

Single-frequency (single axial and lateral spatial mode) operation has been achieved in these devices by correcting for the quadratic phase variation in the lateral dimension using an aperture stop. Because the instability entails excitation of higher order lateral submodes, single frequency operation also is accomplished by using fiber Bragg gratings whose bandwidth is narrower than the submode spacing. This technique is particularly pertinent to the use of lensed fiber gratings in lieu of discrete coupling optics.

Frequency tuning is performed using compression/expansion of the Bragg grating with a piezo-electric actuator. However, stable device operation requires overall phase match between the fed-back signal and the laser output. The fiber Bragg grating acts as a phase-preserving mirror when the Bragg condition is met precisely. The phase-match condition is maintained throughout the fiber tuning range by matching the Fabry-Perot axial mode wavelength to the passband center wavelength of the Bragg grating. This is done by temperature tuning the diode laser.

Figure 10:
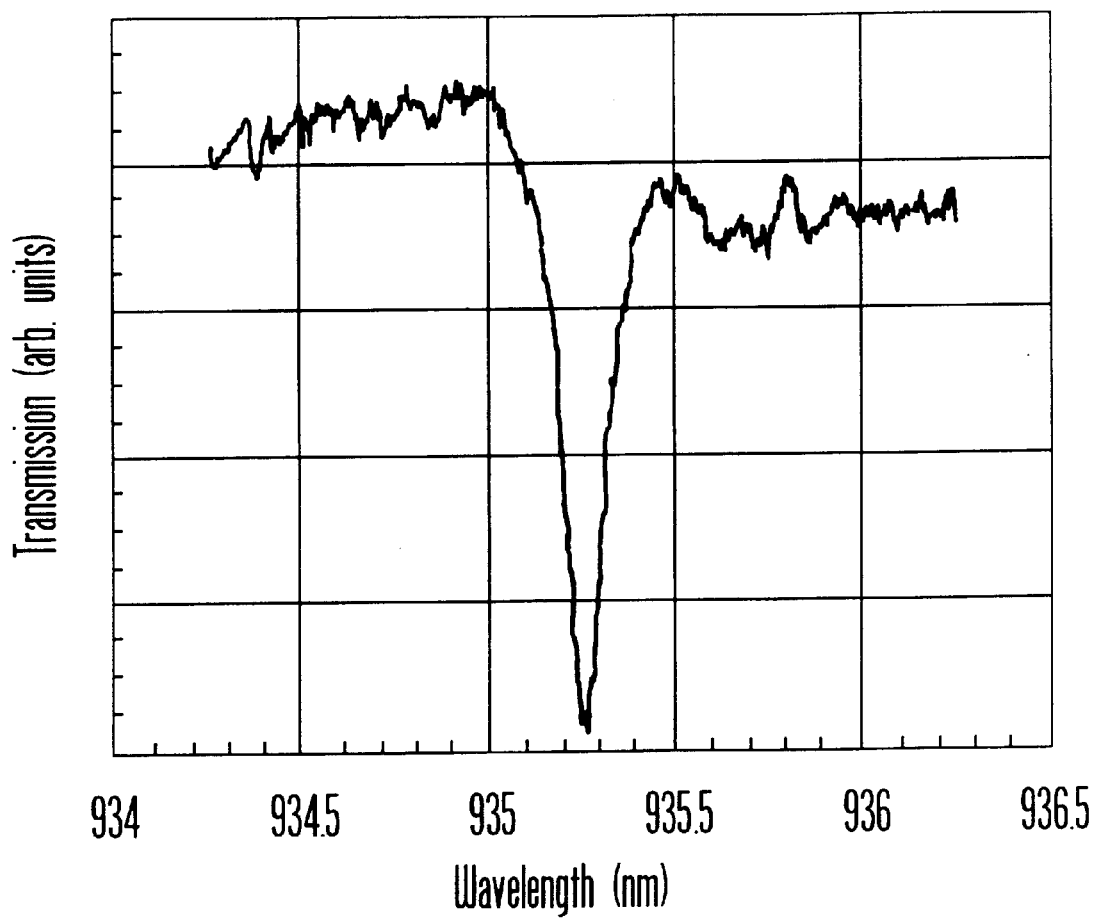
FIG. 10 shows a Bragg Grating Transmission Spectrum.

Origin of Submode Instability:

The modal structure of a Fabry-Perot diode laser is determined by the semiconductor Fabry-Perot cavity itself. The effect of feedback from a fiber Bragg grating is to selectively reinforce those fundamental laser modes that lie within the passband of the grating. For this reason, the bandwidth of the grating is normally chosen to be narrower than the axial mode spacing of the laser. In FIG. 10, the transmission spectrum of the fiber Bragg grating used for this demonstration is shown; its bandwidth is approximately 100 pm. FIG. 11A shows the output spectrum of a Fabry-Perot diode laser stabilized with this grating as measured by an Optical Spectrum Analyzer (OSA). The axial mode spacing for this laser is approximately 140 pm, which clearly persists in the presence of fiber Bragg grating stabilization as seen in the sidemode spacing.

The single prominent spectral line of FIG. 11A does not represent a single laser mode, however. This is demonstrated by analyzing the spectrum with a scanning Fabry-Perot ètalon, as shown in FIG. 11B. Three submodes are clearly present in this spectrum, with the hint of a fourth. This type of submode structure comprises the ordinary spectral output of a Fabry-Perot diode laser stabilized by a fiber Bragg grating.

The submodes are excited because the fiber-feedback cavity design is inherently unstable. The feedback signal from the single-mode fiber containing the Bragg grating is very nearly an ideal $TM_{00}$ Gaussian wavefront without phase aberrations. However, the output of the laser diode is astigmatic, which means that the facet of the laser does not lie in the image plane of the fiber along both axes. For good coupling, the large numerical aperture associated with the transverse axis of the laser dictates the location of the focal plane. As a consequence, a spherical aberration is introduced by the lateral-axis defocusing that manifests itself as a quadratic phase variation in the feedback at the facet of the laser along the lateral axis. The spatial variation of the phase of the feedback relative to that of the originating signal allows for the excitation of higher-order spatial modes than the $TM_{00}$.

Figure 12:
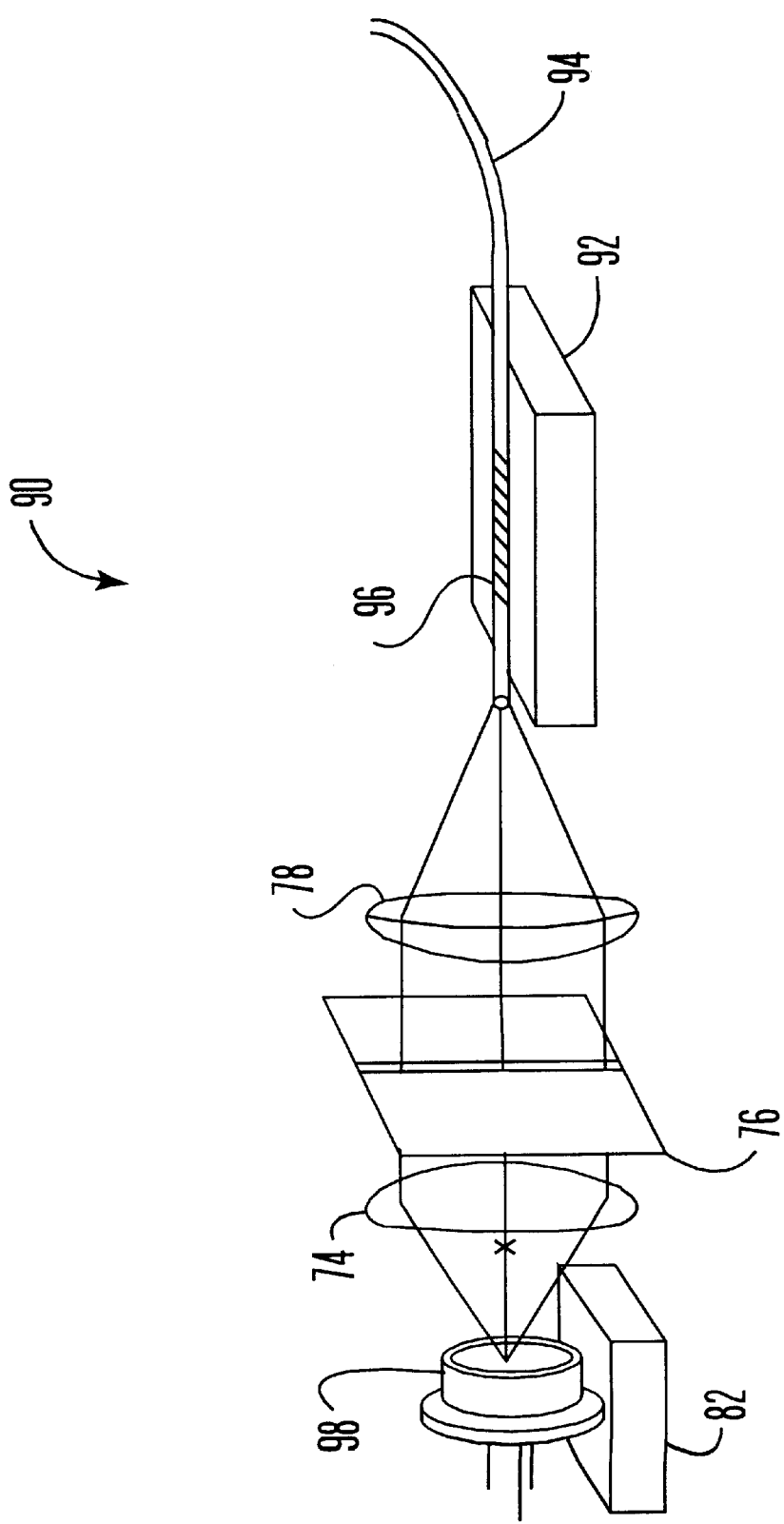
FIG. 12 shows an experimental setup for studying submode instabilities with fiber-grating feedback using a variable width slit as an aperture stop.

Experimental Study:

This effect was studied by means of an experimental setup (90) diagrammed in FIG. 12, comprising a Fabry-Perot laser diode (98), here shown mounted to a thermoelectric cooler (82) coupled through a variable width slit (76) and collimating lenses (74) and (78) to a fiber optic waveguide (94) having a fiber Bragg grating (96) written into a portion of the waveguide. The grating is mounted to a three-axis positioning stage (92) and provides optical feedback to the diode. Acting as an aperture stop, a variable width slit (76) was optically coupled in a path formed by the optical feedback of the grating and the laser diode. The light beam in the path was collimated by using a first collimator, shown here as a collimating lens (74), optically aligning the laser and the aperture stop, and a second collimator, also a collimating lens (78) optically aligning the aperture stop and the optical feedback of the grating. By narrowing the slit (76), a smaller angular fraction of the fed-back wavefront is imaged upon the laser, reducing the phase variation proportionally. As a control, the same experiment was performed using a quarter-wave plate (not shown) in place of the slit (76) to attenuate the feedback without altering the phase properties.

Figure 13:
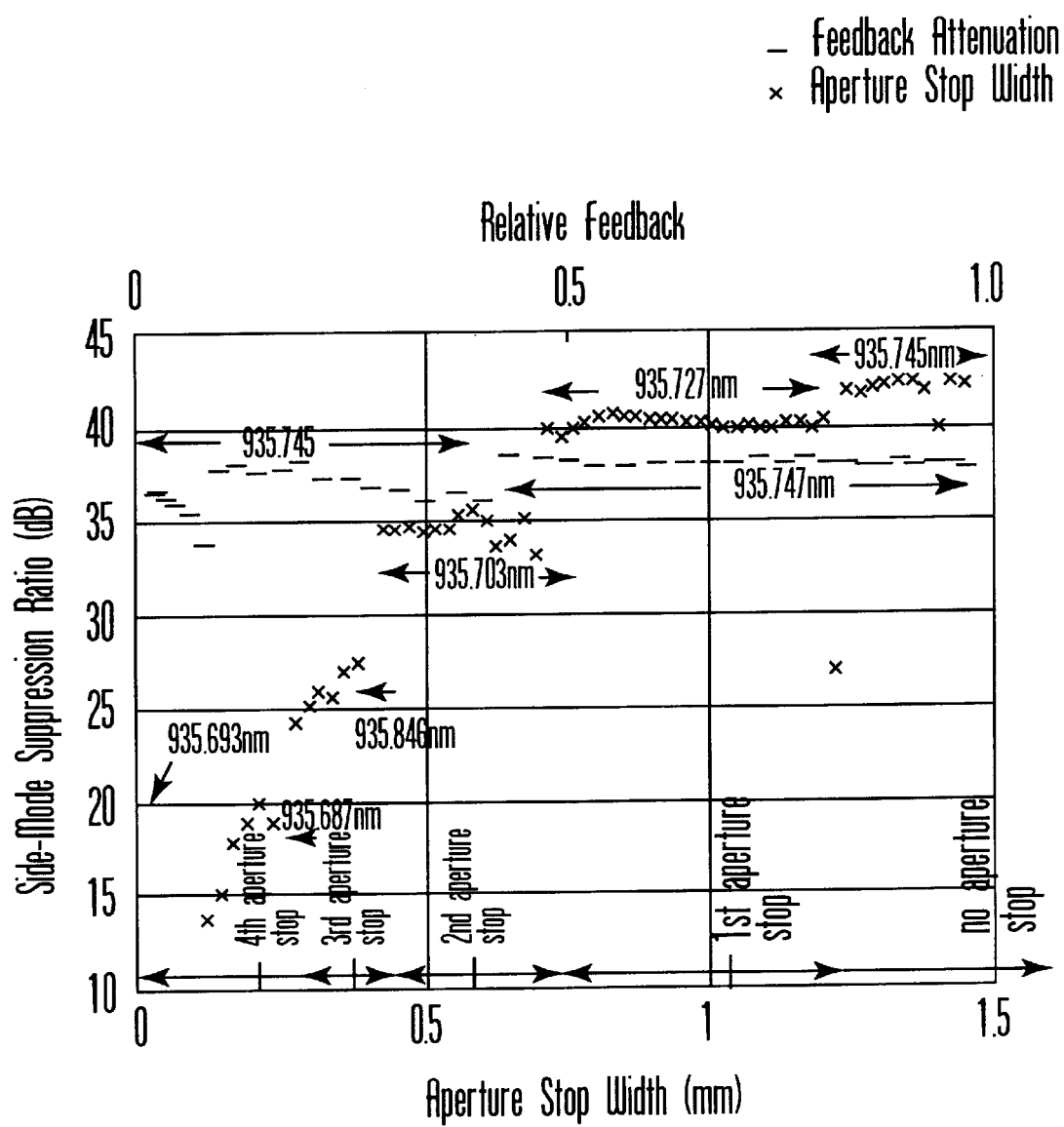
FIG. 13 shows the Mode Stability versus Aperture Stop Width and Relative Feedback Ratio for the experimental setup in FIG. 12.

The results are shown in FIG. 13, in which the side-mode suppression ratio is plotted as a function of slit width and relative feedback fraction. Attenuation alone has virtually no effect on the output. The output with the aperture stop exhibits distinct stability regimes, however, as distinguished by discontinuous changes in the side-mode suppression ratio, accompanied by jumps in the wavelength of the output signal (also indicated on the graph). The fourth aperture stop represents a virtually unaberrated feedback signal. Its poor side mode suppression is an artifact of the tiny fraction of light fed back into the active gain region of the laser, smaller than the total amount for comparable beam attenuation because of beam spreading effects.

Figure 14A:
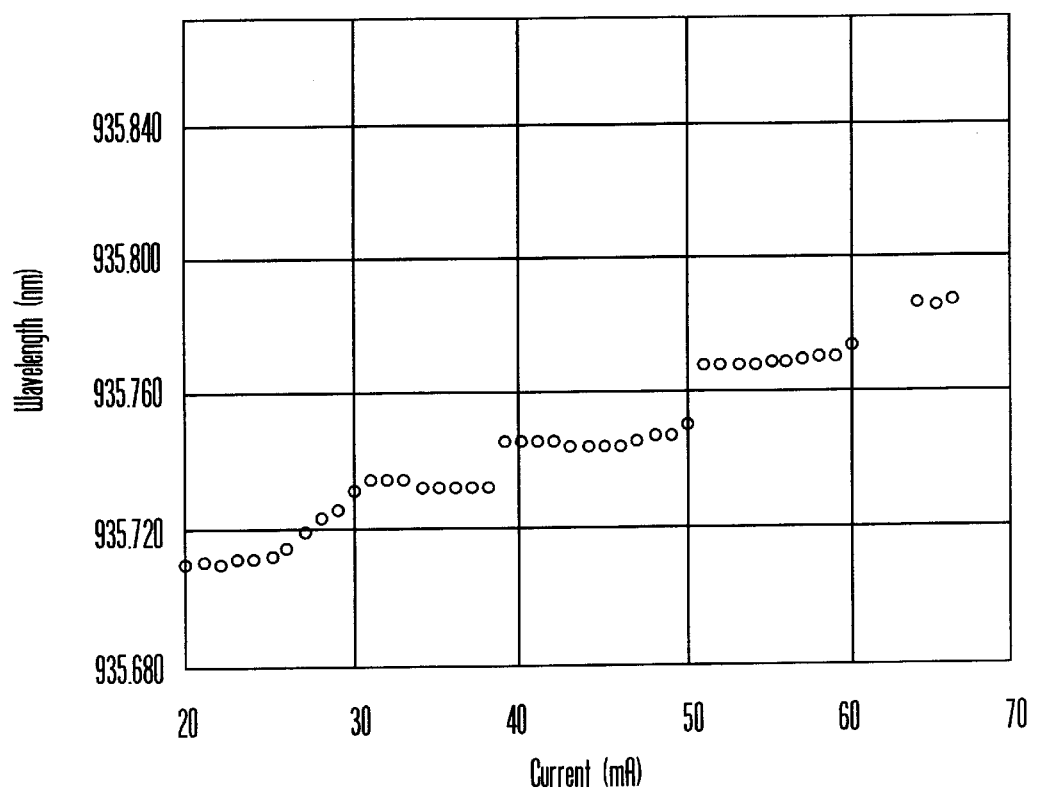
FIG. 14A shows Submode Tuning without an Aperture Stop for the experimental setup in FIG. 12.

Each stability regime for the different aperture stops was studied individually by tuning the laser current from threshold to the highest value consistent with single-frequency operation while measuring the wavelength. Varying the current changes the refractive index of the gain medium through carrier depletion, changing the phase-match conditions at the laser facet. FIG. 14A shows the tuning curve with an open aperture, carefully configured to provide single-frequency output. The tuning curve follows a stair-step pattern with separations of approximately 18 pm, corresponding to successive lateral modes. As previously noted in FIG. 10, the bandwidth of the grating is about 100 pm, as a consequence of which only five submodes can be supported within the grating bandwidth.

Figure 14B:
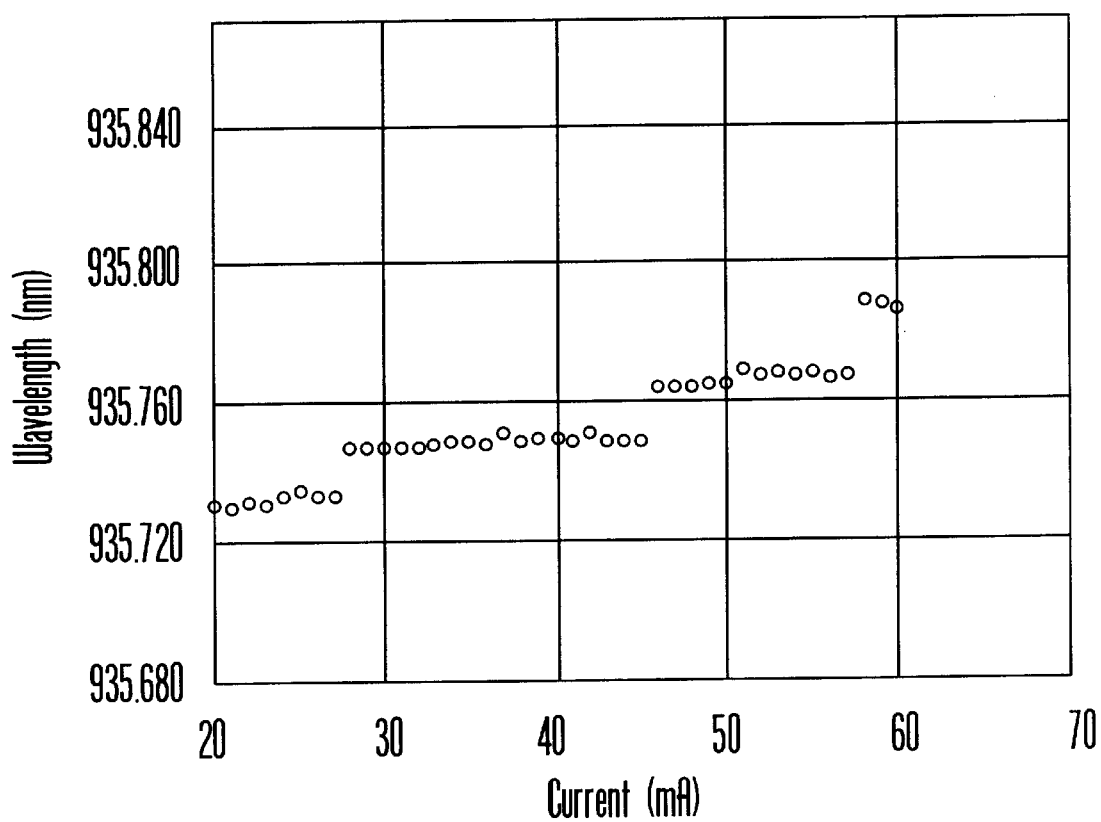
FIG. 14B shows Submode Tuning at the First Aperture Stop for the experimental setup in FIG. 12.
Figure 14C:
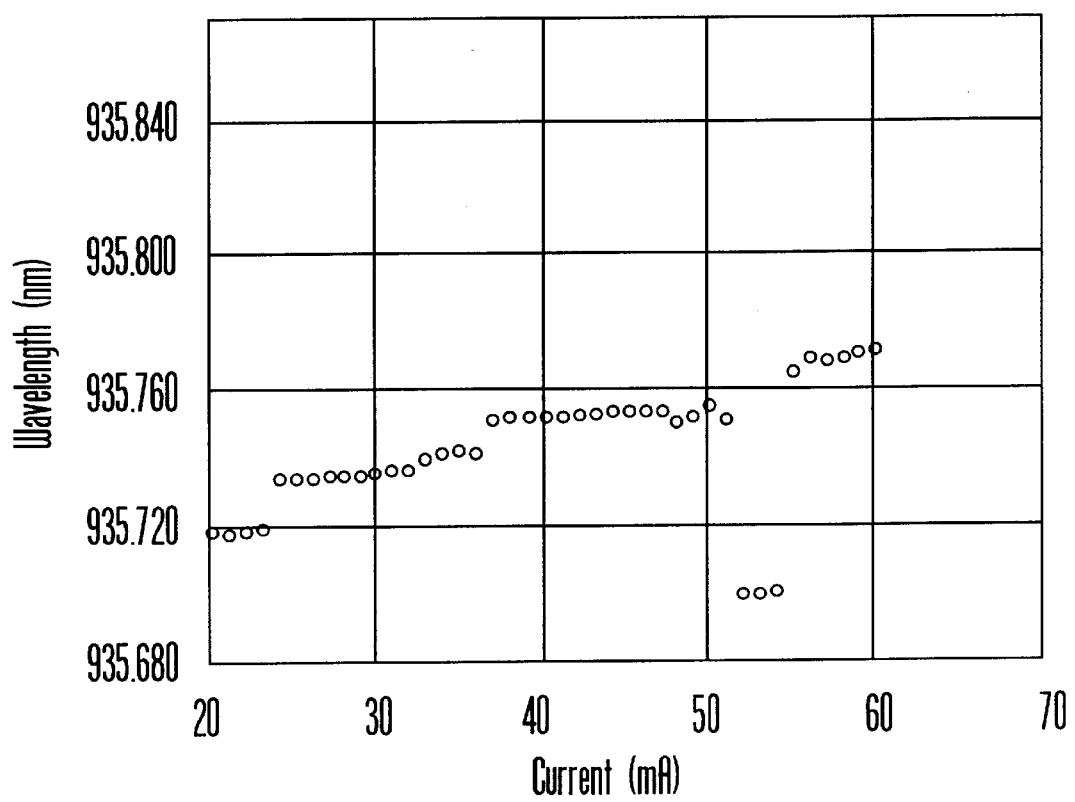
FIG. 14C shows Submode Tuning at the Second Aperture Stop for the experimental setup in FIG. 12.
Figure 14D:
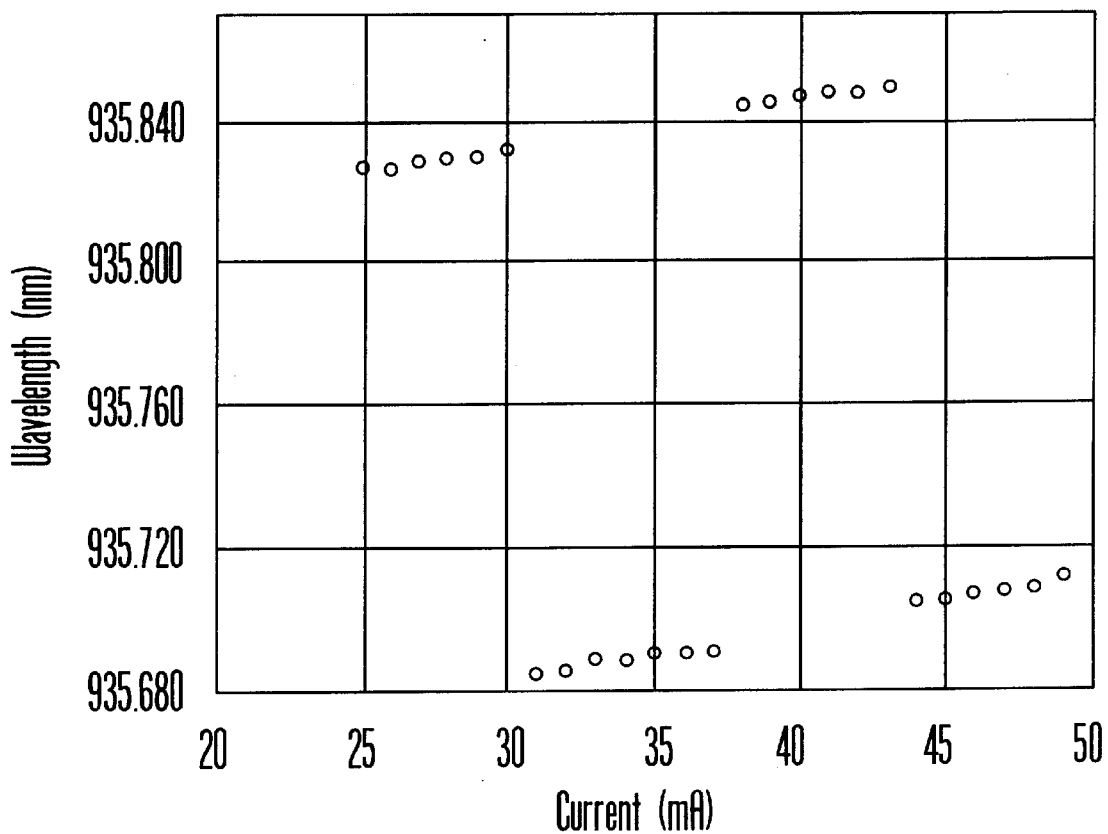
FIG. 14D shows Submode Tuning at the Fourth Aperture Stop for the experimental setup in FIG. 12.

FIGS. 14B, 14C and 14D depict successive submode decimations that result from narrowing the slit to the first, second and fourth aperture stops, respectively. At the first aperture stop (FIG. 14B), only enough phase variation is provided for the laser to tune through four submodes; at the second aperture stop (FIG. 14C). the laser tunes through only three submodes before cycling to the top of the next lower axial mode (then returning to the original axial mode); Finally, at the fourth aperture stop (FIG. 14D), the laser can only alternate between adjacent axial modes since there is insufficient phase variation in the feedback signal to excite any higher order lateral modes.

Theoretical Model:

The submode spectrum can be understood according to the following analysis. The waveguiding structure that confines the optical modes in an index-guided Fabry-Perot laser is provided by the slab-waveguide of the epitaxial growth in the transverse dimension and the incorporation of a guiding ridge in the lateral dimension. Because the index differentials are sufficient to cut off higher-order modes in the transverse dimension, the submodes associated with the spectral instability arises solely from the weak confinement in the lateral dimension. To lowest order, the confining mechanism can be modeled as a quadratic effective index profile:

$$n^2(x,y) = n^2\left(1 - \frac{n_{2x}}{n}x^2 - \frac{n_{2y}}{n}y^2\right)$$

where $n_{2x}$ and $n_{2y}$ characterized the spatial inhomogeneity of the effective refractive index. The general structure of the resulting optical mode is that of an elliptical Gaussian beam:

$$E_{l,m}(x,y,z) = E_0 H_l\left(\frac{\sqrt{2}\,x}{\omega_x}\right) H_m\left(\frac{\sqrt{2}\,y}{\omega_y}\right) \exp\left(-\frac{x^2}{\omega_x^2} - \frac{y^2}{\omega_y^2}\right) \exp(-i\beta_{l,m}z)$$

where $E_0$ is the electric field amplitude, $H_l$ and $H_m$ are Hermite polynomials of the $l^{th}$ and $m^{th}$ order, $\beta_{l,m}$ is the propagation parameter for the $l,m^{th}$ mode, and $\omega_x$ and $\omega_y$ are the beam waists associated with the lateral and transverse axes of the ellipse. Because the refractive index is not uniform, different modes experience a different effective index associated with the different volumes they occupy. This effective index difference splits the wavelength degeneracy of the spatial modes, which can be calculated by considering the end-to-end phase variation in the laser cavity of each mode:

$$\eta = kd - \frac{1}{2}(l+1)\tan^{-1}\left(\frac{\Delta z_x \lambda}{\pi \omega_x^2 n}\right) - \frac{1}{2}(m+1)\tan^{-1}\left(\frac{\Delta z_y \lambda}{\pi \omega_y^2 n}\right)$$

This must be an integer multiple of $\pi$ for the mode to be self reinforcing. Equating the total phase (modulo $\pi$) for two discrete spatial modes with the same transverse index but different lateral indices places the following constraint on the (z-component) wave-vector k:

$$(k_2 - k_1)d = (l_2 - l_1)\tan^{-1}\left(\frac{d\lambda}{\pi \omega_x^2 n}\right)$$

Since the wavelength is related to the wave vector by $$\lambda = \frac{2\pi m}{k},$$

this gives for $\lambda$:

$$\Delta\lambda = \frac{\lambda^2 \Delta l}{2\pi n d}\tan^{-1}\left(\frac{d\lambda}{\pi \omega_x^2 n}\right)$$

For the laser studied here, $\lambda$=935.6 nm, n=3.6, d=750 $\mu$m, $\omega_x$=3 $\mu$m, and assuming $\Delta l$=2 for even parity modes, which are mandated by the reflection symmetry of the phase variation and the center-ridge geometry, this yields:

$$\Delta\lambda = 15 \text{ pm}$$

in good agreement of the observed value of approximately 18 pm (averaged over all tuning curves).

Figure 18:
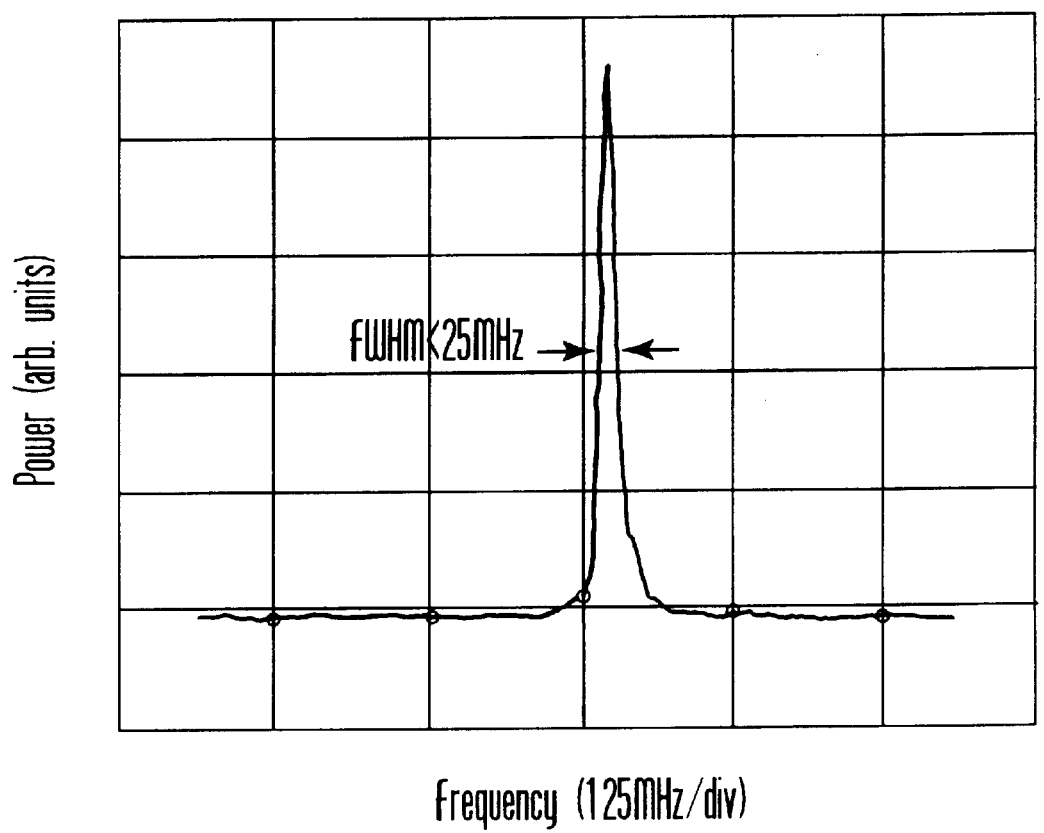
FIG. 18 is the Scanning Fabry-Perot Spectrum of Single Mode Output for a diode laser stabilized with a fiber Bragg grating and a lateral aperture stop of a variable width slit.

A lateral submode suppressor influences the optical feedback of the grating to a light source. When a lateral submode suppressor such as an aperture stop, is used to control the phase variation, stable single-frequency (single lateral mode) output results. The single-frequency spectrum of a diode laser stabilized with a fiber Bragg grating and aperture stop is shown in FIG. 18. The spectrum was taken using a scanning Fabry-Perot étalon; the linewidth measurement is instrument limited to the 25 MHz resolution of the étalon.

Phase Considerations in Tuning:

The feedback from a fiber Bragg grating is most readily modeled using standard coupled-wave analysis. The reflected signal from the Bragg grating is given by:

$$E_{ref}(z) = E_{inc} \frac{i\kappa e^{-i\Delta\beta z}\sinh[S(z-L)]}{-\Delta\beta \sinh SL + iS\cosh SL}$$

where κ is the wave-coupling parameter, $S=\sqrt{k^2-(\Delta\beta)^2}$ and $\Delta\beta$ measures the spectral deviation of the incident light from the center wavelength of the Bragg grating. Note that considerable simplification results when β=0; namely, when the Bragg condition is met precisely. Then the reflected signal becomes:

$$E_{ref}(z) = E_{inc} \frac{\kappa}{|\kappa|} \frac{\sinh h[|\kappa|(z-L)]}{\cosh|\kappa|L}$$

As in all conventional holography, when the Bragg condition is met using a counterpropagating hologram formation (reflection) geometry, the hologram (in this case the fiber Bragg grating) serves to always return a phase conjugate replica of the impinging optical wave. For the single frequency laser diode with fiber grating described here, this means that the distance between the laser diode output facet and the fiber grating is not critical. Thus, when the Bragg condition is met, the fiber Bragg grating is translation invariant with respect to the phase of the fiber grating reflected wave. This offers a distinct device engineering advantage in that (unlike a conventional mirror) no critical longitudinal position alignment is required between the laser diode output facet and the fiber grating under the Bragg condition. The Bragg condition can be achieved by tuning either the laser diode temperature or current.

The fact that there is no position-dependent phase term in this expression means that the Bragg-grating return signal is in phase with the source when the Bragg condition is satisfied. Consequently, the problem of supplying constructive phase-interference between the output signal from the laser and the feedback signal from the fiber Bragg grating at all wavelengths through which the Bragg grating is tuned can be reduced to one of ensuring that the output from the laser always satisfies the Bragg condition, i.e., that the axial-mode wavelength of the laser coincides with the central wavelength of the grating passband.

Figure 15:
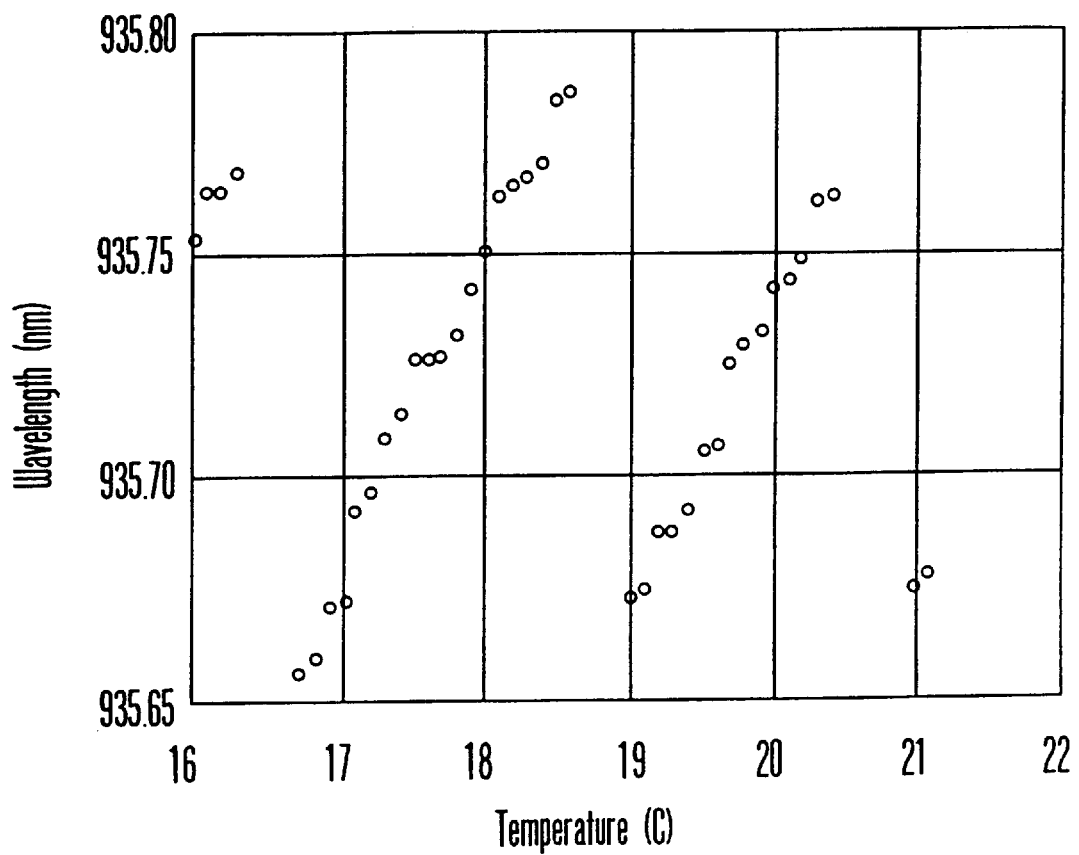
FIG. 15 shows Wavelength vs. Laser Temperature plot as a result of temperature tuning the Fabry-Perot diode laser stabilized by the fiber Bragg grating as shown in the setup in FIG. 12.

This is accomplished by temperature tuning the laser diode synchronously with tuning the grating to change the Fabry-Perot cavity length. FIG. 15 shows the results of temperature tuning a Fabry-Perot diode laser stabilized by a fixed fiber Bragg grating (with phase adjustments made by varying the spacing between collimating lenses): As the temperature increases, the wavelength sweeps through the passband of the grating, jumping to a higher axial mode and repeating the sweep when the wavelength exceeds the passband. The curve exhibits some stair-step behavior because the laser jumps to successive (discrete) submodes as it tunes (this results from the increase in phase mismatch as the wavelength deviates from the Bragg condition, which the submodes accommodate by means of the lateral phase variation). Tuning the grating synchronously with the laser temperature has the effect of keeping the laser output centered on the tuning curve as the curve shifts to the left or right.

Stable $TM_{00}$ single-line operation results from temperature tuning the laser to the center of the grating passband at the operating current. Note that the narrower the bandwidth of the grating relative to the axial-mode spacing of the laser, the wider the gap between successive tuning curves (regions of chaotic instability). The most "forgiving" device results when the bandwidth of the fiber Bragg grating nearly matches the axial mode spacing of the diode laser, which is the case for the data presented here.

An embodiment for tunable single-frequency operation of a Fabry-Perot diode laser using a piezo-electric stage and collimating lenses is presented in FIG. 16. This embodiment employs a lateral aspherizing plate (84) for the aperture stop. This design would be favored when the tolerances for laser temperature and current stability militate against extreme phase sensitivity in the feedback.

A more integrated embodiment for tunable single-frequency operation of a Fabry-Perot diode laser using a piezo-electric stage (88) mounted upon a thermoelectric cooler (86) as a wavelength tuning mechanism is depicted in FIG. 17, where a lensed fiber (98) with a fiber Bragg grating (100) is employed. This design dictates the use of a fiber Bragg grating possessing a bandwidth less than the submode spacing of the laser diode to act as a lateral submode suppressor. For the devices studied here, this would be less than 20 pm. This design is very simple and mechanically robust, but it requires much more precise control of the laser current and temperature to meet the Bragg condition with adequate precision.

The data presented here was for a Fabry-Perot laser diode, but other quasimonochromatic light sources such as semiconductor laser diodes, light emitting diodes, semiconductor optical amplifiers, fiber optic lasers, and fiber optic amplifiers can be substituted for the laser diode in order to achieve single frequency output.

Obviously, many modifications and variations of the present invention are possible in light of the above teachings. It is therefore to be understood that within the scope of the appended claims the invention may be practiced otherwise than as specifically described.

What is claimed is:

1. A light source apparatus comprising:
    a quasi-monochromatic light source, optically coupled to a fiber optic waveguide, having a Bragg grating written into a portion of the waveguide; said grating having a center wavelength, said grating providing optical feedback to the light source; said light source having an axial mode, lateral submodes and a lateral submode spacing; said axial mode having a wavelength; the optical feedback of the grating pulling the axial mode wavelength to the center wavelength of the grating; a refractive index controller for controlling a refractive index of the quasi-monochromatic light source so that the axial mode wavelength coincides with the center wavelength of the grating; and a lateral submode suppressor for influencing the optical feedback of the grating to the light source so that a single frequency output of the light source apparatus results.

2. The light source apparatus of claim 1 wherein said lateral submode suppressor comprises:
    a lateral aperture stop;
    a first collimator for collimating the axial mode wavelength of the quasimonochromatic light source, said first collimator optically aligned between the light source and said lateral aperture stop; and
    a second collimator optically aligned between said lateral aperture stop and the fiber optic waveguide for collimating the optical feedback of the grating.

3. The light source apparatus of claim 2 wherein said lateral aperture stop is a variable width slit.

4. The light source apparatus of claim 2 wherein said lateral aperture stop is a lateral aspherizing plate.

5. The light source apparatus of claim 1 wherein the lateral submode suppressor is said grating having a bandwidth less than the lateral submode spacing of the quasi-monochromatic light source.

6. The light source apparatus of claim 1 wherein the quasi-monochromatic light source is a semiconductor optical amplifier.

7. The light source apparatus of claim 1 wherein the quasi-monochromatic light source is a light-emitting diode.

8. The light source apparatus of claim 1 wherein the quasi-monochromatic light source is a Fabry-Perot laser diode.

9. The light source apparatus of claim 1 wherein said refractive index controller is a temperature controller thermally coupled to the quasi-monochromatic light source to temperature tune the light source.

10. The light source apparatus of claim 1 wherein said refractive index controller is a current controller connected to the quasi-monochromatic light source to tune the light source by current modulation.

11. The light source apparatus of claim 1 wherein said refractive index controller comprises a current controller connected to the quasi-monochromatic light source to tune the light source by current modulation and a temperature controller thermally-coupled to the quasi-monochromatic light source to temperature tune the light source, said current controller and temperature controller being operated together.

12. A light source apparatus comprising:
a quasi-monochromatic light source, optically coupled to a fiber optic waveguide, having a Bragg grating written into a portion of the waveguide; said grating having a passband of wavelengths and a tunable center wavelength, a wavelength tuning mechanism being applied to said grating to obtain a tuned center wavelength, said grating providing optical feedback to the light source; said light source having an axial mode, lateral submodes and a lateral submode spacing; said axial mode having a wavelength; the optical feedback of the grating pulling the axial mode wavelength to the tuned center wavelength of the grating; a refractive index controller for controlling a refractive index of the quasi-monochromatic light source so that the axial mode wavelength coincides with the tuned center wavelength of the grating; and a lateral submode suppressor for influencing the optical feedback of the grating to the light source so that a single frequency output of the light source apparatus results.

13. The light source apparatus of claim 12 wherein said lateral submode suppressor comprises:
a lateral aperture stop;
a first collimator for collimating the axial mode wavelength of the quasi-monochromatic light source, said first collimator optically aligned between the light source and said lateral aperture stop; and
a second collimator optically aligned between said lateral aperture stop and the fiber optic waveguide for collimating the optical feedback of the grating.

14. The light source apparatus of claim 13 wherein said lateral aperture stop is a variable width slit.

15. The light soure apparatus of claim 13 wherein said lateral aperture stop is a lateral aspherizing plate.

16. The light source apparatus of claim 12 wherein the lateral submode suppressor is said grating having a bandwidth less than the lateral submode spacing of the quasi-monochromatic light source.

17. The light source apparatus of claim 12 wherein the quasi-monochromatic light source is a semiconductor optical amplifier.

18. The light source apparatus of claim 12 wherein the quasi-monochromatic light source is a light-emitting diode.

19. The light source apparatus of claim 12 wherein the quasi-monochromatic light source is a Fabry-Perot laser diode.

20. The light source apparatus of claim 12 wherein said refractive index controller is a temperature controller thermally coupled to the quasi-monochromatic light source to temperature tune the light source.

21. The light source apparatus of claim 12 wherein said refractive index controller is a current controller connected to the quasi-monochromatic light source to tune the light source by current modulation.

22. The light source apparatus of claim 12 wherein said refractive index controller comprises a current controller connected to the quasi-monochromatic light source to tune the light source by current modulation and a temperature controller thermally-coupled to the quasi-monochromatic light source to temperature tune the light source, said current controller and temperature controller being operated together.

23. A light source apparatus comprising:
a Fabry-Perot laser diode, optically coupled to a fiber optic waveguide, having a Bragg grating written into a portion of the waveguide; said grating having a passband of wavelengths and a tunable center wavelength, a wavelength tuning mechanism being applied to said grating to obtain a tuned center wavelength, said grating providing optical feedback to the laser diode; said laser diode having an axial mode, lateral submodes and a lateral submode spacing; said axial mode having a wavelength; the optical feedback of the grating pulling the axial mode wavelength to the tuned center wavelength of the grating; a refractive index controller for controlling a refractive index of the laser diode so that the axial mode wavelength coincides with the tuned center wavelength of the grating; and a lateral submode suppressor for influencing the optical feedback of the grating to the light source so that a single frequency output of the light source apparatus results.

24. The light source apparatus of claim 23 wherein said lateral submode suppressor comprises:
a lateral aperture stop;
a first collimator for collimating the axial mode of the laser diode, said first collimator optically aligned between the laser diode and said lateral aperture stop; and
a second collimator optically aligned between said lateral aperture stop and the fiber optic waveguide for collimating the optical feedback of the grating.

25. The light source apparatus of claim 24 wherein said lateral aperture stop is a variable width slit.

26. The light source apparatus of claim 23 wherein said lateral aperture stop is a lateral aspherizing plate.

27. The light source apparatus of claim 23 wherein the lateral submode suppressor is said grating having a bandwidth less than the lateral submode spacing of the laser diode.

28. The light source apparatus of claim 23 wherein said refractive index controller is a temperature controller thermally coupled to the quasi-monochromatic light source to temperature tune the light source.

29. The light source apparatus of claim 23 wherein said refractive index controller is a current controller connected to the quasi-monochromatic light source to tune the light source by current modulation.

30. The light source apparatus of claim 23 wherein said refractive index controller comprises a current controller connected to the quasi-monochromatic light source to tune the light source by current modulation and a temperature controller thermally-coupled to the quasi-monochromatic light source to temperature tune the light source, said current controller and temperature controller being operated together.

31. A spectrometer apparatus comprising:
the light source apparatus of claim 1 being optically coupled to a test subject that is optically coupled to an optical detector so that the optical detector has a received light signal from the test subject.

32. The spectrometer apparatus of claim 31 further comprising a signal processor electrically connected to the optical detector wherein the optical detector converts the received light signal to an electrical signal, the electrical signal being sent to the signal processor.

33. A spectrometer apparatus comprising:
the light source apparatus of claim 12 being optically coupled to a test subject that is optically coupled to an optical detector.

34. The spectrometer apparatus of claim 33 further comprising a signal processor electrically connected to the optical detector wherein the optical detector converts the received light signal to an electrical signal, the electrical signal being sent to the signal processor.

35. A spectrometer apparatus comprising:
the light source apparatus of claim 23 being optically coupled to a test subject that is optically coupled to an optical detector.

36. The spectrometer apparatus of claim 35 further comprising a signal processor electrically connected to the optical detector wherein the optical detector converts the received light signal to an electrical signal, the electrical signal being sent to the signal processor.

37. A spectrometer apparatus comprising:
a fiber grating coupled transmitter and an optical detector, said transmitter comprising a quasi-monochromatic light source, optically coupled to a fiber optic waveguide, having a grating written into a portion of the waveguide, said grating having a passband of wavelengths and a tunable center wavelength, a wavelength tuning mechanism being applied to said grating for tuning the center wavelength, said grating providing optical feedback to the light source so that a wavelength of the light source is tuned to within a narrow optical spectral width of the center wavelength resulting in a tuned wavelength from the transmitter;
said fiber grating coupled transmitter being optically coupled to a test subject that is optically coupled to the optical detector so that the optical detector has a received light signal from the test subject.

38. The spectrometer apparatus of claim 37 further comprising a signal processor electrically connected to the optical detector wherein the optical detector converts the received light signal to an electrical signal, the electrical signal being sent to the signal processor.

39. The spectrometer apparatus of claim 37 wherein the quasi-monochromatic light source is a semiconductor optical amplifier.

40. The spectrometer apparatus of claim 37 wherein the quasi-monochromatic light source is a light-emitting diode.

41. The spectrometer apparatus of claim 37 wherein the quasi-monochromatic light source is a Fabry-Perot laser diode.

42. The spectrometer apparatus of claim 41 further comprising a temperature controller thermally coupled to the laser diode; and
a laser diode current supply;
said laser diode is being maintained at a temperature by the temperature controller and operating at a current supplied by the current supply, the tuned wavelength of the transmitter being tuned to the center wavelength of the grating, said center wavelength being tuned in response to the wavelength tuning mechanism.

43. The spectrometer apparatus of claim 42 wherein said laser diode has a wavelength tunable in response to temperatures and is operating at a current, the center wavelength of the grating being tuned to a desired wavelength, and the tuned wavelength of the transmitter being adjusted within the grating's passband in response to temperature tuning of the laser diode by varying the temperature of the temperature controller .

44. The spectrometer apparatus of claim 42 wherein said laser diode is being maintained at a temperature by the temperature controller and has a wavelength tunable in response to a current, the center wavelength of the grating being tuned to a desired wavelength, and the tuned wavelength of the transmitter being adjusted within the grating's passband in response to modulation of the current of the laser diode.

45. The spectrometer apparatus of claim 44 wherein said fiber grating coupled transmitter further comprises:
an optical amplifier into which the tuned wavelength of the transmitter is optically coupled resulting in a master oscillator power amplifier configuration of the transmitter capable of high power output.

46. The spectrometer apparatus of claim 45 further comprising an optical isolator optically coupling the transmitter and the amplifier so that feedback from the optical amplifier does not affect the tuned wavelength.

47. The light source apparatus of claim 1 wherein said grating is a sampled Bragg grating.

48. The light source apparatus of claim 12 wherein said grating is a sampled Bragg grating.

49. The light source apparatus of claim 23 wherein said grating is a sampled Bragg grating.

50. The spectrometer apparatus of claim 37 wherein said grating is a sampled Bragg grating.

* * * * *